United States Patent
Sasayama

(10) Patent No.: US 7,189,015 B2
(45) Date of Patent: Mar. 13, 2007

(54) METHOD FOR REPLENISHING DEVELOPMENT REPLENISHER IN AUTOMATIC DEVELOPING MACHINE FOR PHOTOSENSITIVE LITHOGRAPHIC PRINTING PLATE PRECURSOR

(75) Inventor: Hiroyuki Sasayama, Haibara-gun (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 143 days.

(21) Appl. No.: 11/145,978

(22) Filed: Jun. 7, 2005

(65) Prior Publication Data
US 2005/0271381 A1    Dec. 8, 2005

(30) Foreign Application Priority Data
Jun. 8, 2004 (JP) .............................. 2004-170159
Jun. 2, 2005 (JP) .............................. 2005-162965

(51) Int. Cl.
*G03D 3/02* (2006.01)
(52) U.S. Cl. .......................... 396/578; 396/626; 355/27
(58) Field of Classification Search ................ 396/578, 396/626
See application file for complete search history.

(56) References Cited

U.S. PATENT DOCUMENTS 4,882,246 A * 11/1989 Ohba et al. .................. 396/626
6,364,544 B1 * 4/2002 Sasayama et al. ........... 396/578
6,866,432 B2 * 3/2005 Sasayama .................... 396/571
7,024,996 B2 * 4/2006 Sasayama ................. 101/463.1

FOREIGN PATENT DOCUMENTS

JP    64-21451 A    1/1989

* cited by examiner

*Primary Examiner*—D. Rutledge
(74) *Attorney, Agent, or Firm*—Buchanan Ingersoll & Rooney PC

(57) ABSTRACT

A method for replenishing a development replenisher in an automatic developing machine for a photosensitive lithographic printing plate precursor, wherein a value of an electric conductivity of a developer obtained by measuring an electric conductivity is compared with a reference value, and a development replenisher is replenished to the developer when the value of the developer is lower than the reference value, the method comprising: using a reference value of an electric conductivity optimal for a high resolution image as the reference value when developing a precursor having an exposed high resolution image in which an output datum of 50% area ratio is 210 lpi or more in terms of a peripheral length of an image area in an image unit that constitutes a gradation of a screen image: and changing the reference value to an ordinary reference value when developing a precursor not having a high resolution image.

7 Claims, 6 Drawing Sheets

METHOD FOR REPLENISHING DEVELOPMENT REPLENISHER IN AUTOMATIC DEVELOPING MACHINE FOR PHOTOSENSITIVE LITHOGRAPHIC PRINTING PLATE PRECURSOR

BACKGROUND OF THE INVENTION

1. Field of the Invention

The present invention relates to a method for replenishing a development replenisher in an automatic developing machine for a photosensitive lithographic printing plate precursor. In particular, it relates to a technique for minimizing fluctuation in developer sensitivity of high resolution image due to change in development processing conditions.

2. Description of the Related Art

In order to control the sensitivity of developer in the automatic developing machine for a photosensitive lithographic printing plate precursor, there is ordinarily employed a system of replenishing a development replenisher according to time lapse and processing amount to a developer (hereinafter referred to as an "area and time lapse-based replenishment system"), where the development replenisher is replenished with the passage of time to a developing tank storing the developer and at the same time, the development replenisher is replenished in an amount according to a value determined by measuring a plate area of the lithographic printing plate precursor processed.

Specifically, as the method of replenishing a development replenisher in the automatic developing machine for a photosensitive lithographic printing plate precursor, a system of replenishing a development replenisher to a developer (hereinafter referred to as an "electric conductivity-based replenishment system") is known as described, for example, in JP-A-1-21451, where electric conductivity of the developer is measured, the measured value is compared with an electric conductivity value for providing an optimum sensitivity (hereinafter referred to an "adequate electric conductivity value") that is experimentally determined previously, and the development replenisher is replenished when the measured value is below the adequate electric conductivity value. The electric conductivity-based replenishment system ensures replenishment of an adequate amount of development replenisher to adequately maintain the sensitivity of developer, even when the plate area, one surface/both surfaces and species of the lithographic printing plate precursor processed are changed.

SUMMARY OF THE INVENTION

However, in the case of developing a photosensitive lithographic printing plate precursor having an exposed high resolution image (an image in which an output datum of 50% area ratio is 210 lpi (Lines Per Inch) or more in terms of a peripheral length of an image area in an image unit that constitutes a gradation of a screen image), since a ratio of boundary portion of image area/non-image area in which an exposure amount is unstable increases, fluctuation of development performance is apt to occur in the boundary portion, which results often in generation of image unevenness. Thus, it is necessary to maintain highly and stably the developer sensitivity in order to ensure gradation reproducibility.

When a photosensitive lithographic printing plate precursor having an exposed high resolution image is processed by an automatic developing machine for a photosensitive lithographic printing plate precursor ordinarily used, however, the gradation reproducibility of the image deteriorates and it is often required to exchange the developer in a short period of time. This is because a controlling method of development sensitivity used in many automatic developing machines is based on a processing amount and time lapse replenishment system where replenishment according to the lapse of time and replenishment according to a value determined by measuring a plate area of the lithographic printing plate precursor processed are performed. The processing amount and time lapse replenishment system cannot stably maintain sensitivity in such a manner that the gradation reproducibility of high resolution image can be assured, because it is difficult to determine the plate area, to discriminate whether one surface or both surfaces, or to determine the plate species (for example, difference in an coating amount of photosensitive layer).

Further, it is known that the high resolution image is different from a ordinary image with respect to developer sensitivity conditions for making gradation of an image on a plate formed according to the development processing equal to gradation of an original exposure image, since the high resolution image has a high ratio of the boundary portion of image area/non-image area in which an exposure amount is unstable as described above.

Accordingly, the desired gradation cannot be stably obtained when the developer sensitivity conditions do not meet the high resolution image, even if it becomes possible to improve the gradation reproducibility of image or to elongate life of the developer irrespective of change in the plate area, one surface or both surfaces, or plate species (for example, difference in an coating amount of photosensitive layer) by using the electric conductivity-based replenishment system as described in Patent Document 1, specifically, the system of replenishing a development replenisher where electric conductivity of the developer is measured, the measured value is compared with an electric conductivity value for providing an optimum sensitivity (adequate electric conductivity value) that is experimentally determined previously, and a development replenisher is replenished when the measured value is below the adequate electric conductivity value.

Under these circumstances, an object of the present invention is to actualize a method for replenishing a development replenisher in an automatic developing machine in which gradation of an image obtained by development processing stably has the desired density even when a photosensitive lithographic printing plate precursor having an exposed high resolution image (an image in which an output datum of 50% area ratio is 210 lpi (Lines Per Inch) or more in terms of a peripheral length of an image area in an image unit that constitutes a gradation of a screen image) is subjected to the development processing.

The term "development replenisher" as used in the present invention means a processing solution replenished so as to keep constant the development performance. The replenisher ordinarily includes that obtained by diluting a replenisher stock solution with a diluent (e.g., water) and the replenisher stock solution itself using without diluting it. In the present invention, the "development replenisher" means a processing solution prepared by diluting a replenisher stock solution with a diluent. The replenishment method includes a method where a replenisher prepared by previously diluting a replenisher stock solution may be replenished to a developer and a method where a replenisher stock solution and a diluent may be separately replenished directly to a developer.

Also, in the present invention, an electric conductivity sensor for measuring an electric conductivity value of developer means a known device, for example, an alternating current electric conductivity meter, an alternating current bridge meter and other electric conductivity meters. In addition, optimal conditions of measured current value, oscillating frequency and the like of the measuring device vary depending on the composition or the like of the developer. However, in view of the device and for preventing electrolysis of the water-soluble developer, the current value is preferably low to a certain extent, specifically, from several hundreds of mA to several μA. Furthermore, in view of relationship with an electrostatic capacity component in the developer, the frequency is preferably from several hundreds of Hz to several hundreds of kHz.

The electric conductivity value of developer containing an electrolyte depends on temperature of the aqueous solution, and the value decreases as the liquid temperature rises. Accordingly, the electric conductivity is more preferably measured by a measuring device equipped with a temperature sensor and a temperature compensating circuit. Also, the temperature may be compensated by converting an actually measured liquid resistance value and liquid temperature into an electric conductivity value at a predetermined temperature in a control device for controlling the replenishment. A sensor of the alternating current electric conductivity meter, alternating current bridge meter or other electric conductivity meter may be disposed at any position as long as it is a place where the sensor can be immersed in the developer at the measurement and can measure the alternating current electric conductivity value of the developer. For example, the sensor is preferably disposed in a developer circulation system of an automatic developing machine, particularly, in a developing tank or circulation pipe. As for a detecting unit, a known measuring cell using as an electrode, platinum, stainless steel or the like can be employed.

The above-described object can be attained by a method for replenishing a development replenisher in an automatic developing machine for a photosensitive lithographic printing plate precursor according to the present invention.

(1) A method for replenishing a development replenisher in an automatic developing machine for a photosensitive lithographic printing plate precursor, wherein a value of an electric conductivity of a developer obtained by measuring an electric conductivity of the developer is compared with a reference value of an electric conductivity, and a development replenisher is replenished to the developer when the value of the electric conductivity of the developer is lower than the reference value of the electric conductivity, the method comprising:

using a reference value of an electric conductivity optimal for a high resolution image as the reference value of the electric conductivity when developing a photosensitive lithographic printing plate precursor having an exposed high resolution image in which an output datum of 50% area ratio is 210 lpi or more in terms of a peripheral length of an image area in an image unit that constitutes a gradation of a screen image: and changing the reference value of the electric conductivity to an ordinary reference value of an electric conductivity when developing a photosensitive lithographic printing plate precursor not having a high resolution image.

(2) The method as described in (1) above, wherein the high resolution image is an image comprising an AM screen having 210 lpi or more.

(3) The method as described in (1) above, wherein the high resolution image is an image comprising an FM screen including a dot of 30 μm or less that constitutes an image area of the screen image.

(4) The method as described in (1) above, wherein the high resolution image comprises at least one of an image comprising an AM screen having 210 lpi or more and an image comprising an FM screen including a dot of 30 μm or less that constitutes an image area of the screen image.

(5) The method as described in any of (1) to (4) above, wherein the reference value of the electric conductivity optimal for the high resolution image is adjusted based on a total amount of the photosensitive lithographic printing plate precursor processed with the developer.

(6) The method as described in any of (1) to (4) above, wherein the reference value of the electric conductivity optimal for the high resolution image is adjusted based on a replenisher replacement ratio, and wherein the replenisher replacement ratio is a ratio of the development replenisher replenished to the developer based on the developer.

(7) The method as described in any of (1) to (4) above, wherein the reference value of the electric conductivity optimal for the high resolution image is adjusted based on a time lapse replenishment ratio and a replenisher replacement ratio, and wherein the time lapse replenishment ratio is a ratio of a time lapse replenishment amount calculated from an operating time and a stopped time of the automatic developing machine based on a total replenishment amount, and the replenisher replacement ratio is a ratio of the development replenisher replenished to the developer based on the developer.

DETAILED DESCRIPTION OF THE INVENTION

Figure 1:
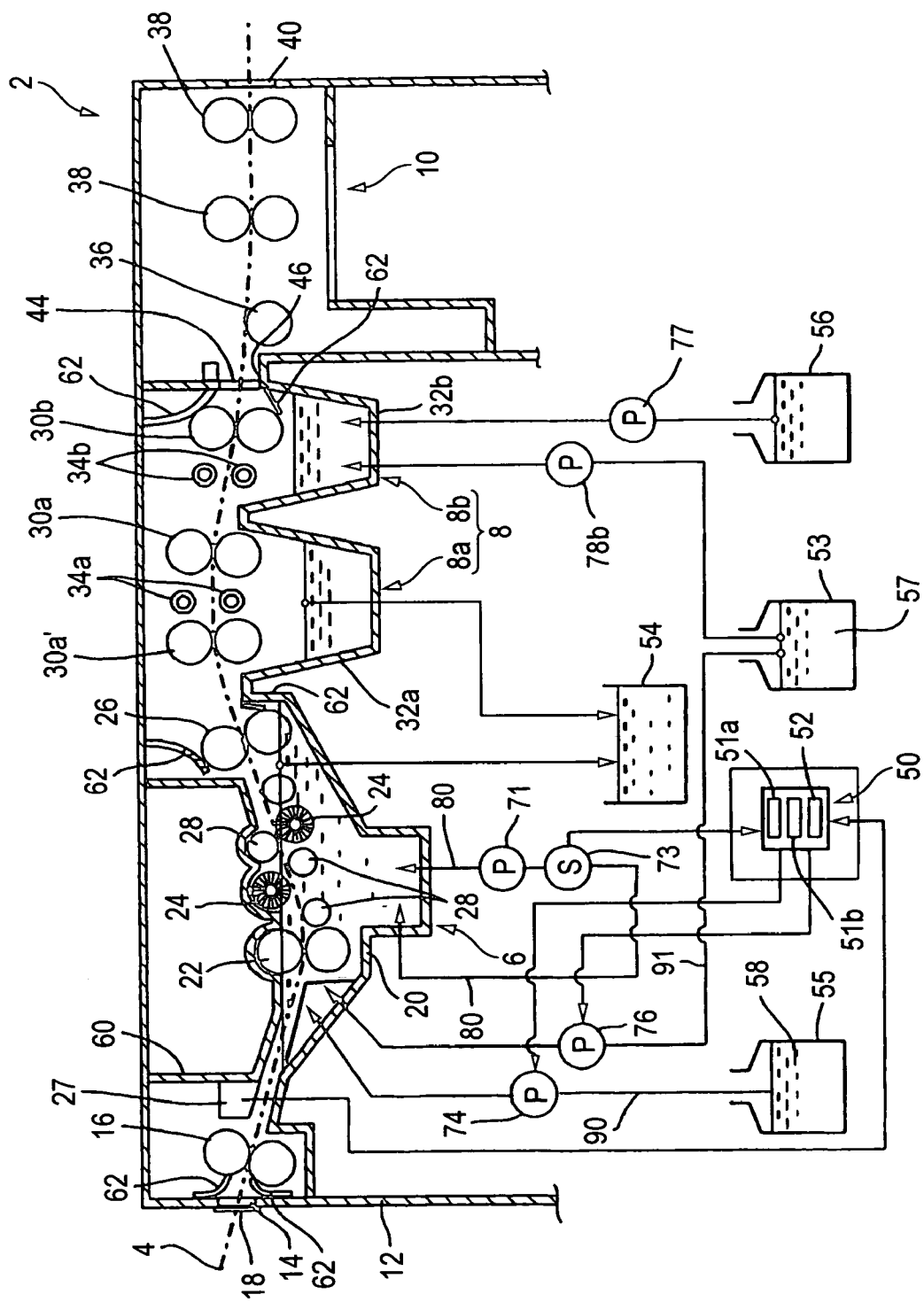
FIG. 1 shows a constitutional view showing a first embodiment of an automatic developing machine used for practicing the development replenishment method according to the present invention.

The method for replenishing a development replenisher in an automatic developing machine for a photosensitive lithographic printing plate precursor according to the present invention comprises replenishing a development replenisher containing an electrolyte and an electric conductivity adjusting agent for elevating the electric conductivity is replenished based on previously established replenishing conditions in order to compensate reduction of development activity occurred at an operation time and/or a stopped time of an automatic developing machine. More specifically, the method comprises after replenishing a development replenisher based on previously established replenishing conditions in order to compensate the reduction of development activity caused by processing of photosensitive lithographic printing plate precursors, when a measured value of electric conductivity of the developer replenished with the development replenisher is lower than an electric conductivity target value calculated using a replenisher replacement ratio and/or a time lapse replenishment ratio and/or a developer dilution ratio, a diluent is replenished to the developing tank until the measured electric conductivity value exceeds the electric conductivity target value. The method is characterized by using a predetermined reference value of electric conductivity optimal for a high resolution image in place of an ordinary reference value of electric conductivity in the case of developing a photosensitive lithographic printing plate precursor having an exposed high resolution image an image in which an output datum of 50% area ratio is 210 lpi (Lines Per Inch) or more in terms of a peripheral length of an image area in an image unit that constitutes a gradation of a screen image. The method for replenishing a development replenisher in an automatic developing machine for a photosensitive lithographic printing plate precursor according to the present invention will be described in more detail below.

The high resolution image mentioned in the present invention means an image that satisfies the following conditions.

1) An image formed of an AM screen having 210 lpi or more.
2) An image formed of an FM screen composed of a dot of 30 μm or less that constitutes an image area of a screen image.
3) An image formed of an AM/FM hybrid screen including an image region that satisfies the above conditions 1) or 2) in at least part of the screen.

The alkali development processing solution for use in plate-making for a lithographic printing plate precursor of the present invention is described below.

The alkali development processing solution (hereinafter sometimes simply referred to as a "developer") for use in the development processing is an alkaline aqueous solution and can be appropriately selected from conventionally known aqueous alkali solutions. Examples of the aqueous alkali solution include a developer comprising an alkali silicate and a base and a developer comprising a nonreducing sugar and a base. In particular, those having a pH of 12.5 to 14.0 are preferred. The alkali silicate is that showing alkalinity when dissolved in water, and examples thereof include an alkali metal silicate, for example, sodium silicate, potassium silicate or lithium silicate, and ammonium silicate. The alkali silicates may be used individually or in combination of two or more thereof.

The developing property of the aqueous alkali solution can be easily adjusted by controlling a mixing ratio of silicon oxide $SiO_2$ and alkali oxide $M_2O$ (M represents an alkali metal or an ammonium group) that are the silicate components, or controlling a concentration. Among the above-described aqueous alkali solutions, those where a mixing ratio of silicon oxide $SiO_2$ to alkali oxide $M_2O$ ($SiO_2/M_2O$ by mol) is from 0.5 to 3.0 are preferred, and those where the mixing ratio is from 1.0 to 2.0 are more preferred.

When the ratio of $SiO_2/M_2O$ is less than 0.5, an alkali strength increases so that a problem may occur in that an aluminum plate widely used as a support for the lithographic printing plate precursor is etched, whereas when it exceeds 3.0, the developing property may decrease.

A concentration of the alkali silicate in the developer is preferably from 1 to 10% by weight, more preferably from 3 to 8% by weight, and most preferably from 4 to 7% by weight, based on the weight of the aqueous alkali solution. When the concentration is less than 1% by weight, the developing property and processing ability may decrease, whereas when it exceeds 10% by weight, precipitate or crystal is readily formed, or at neutralization of the waste solution thereof, gelation is liable to occur and the waste solution treatment may be disturbed.

In the developer comprising a nonreducing sugar and a base, the nonreducing sugar means a saccharide having no reducing property due to absence of a free aldehyde group or a free ketone group. The nonreducing sugar is classified into a trehalose-type oligosaccharide where reducing groups are bonded to each other; a glycoside where a reducing group of saccharide is bonded to a non-saccharide; and a sugar alcohol produced by reducing a saccharide through hydrogenation. In the present invention, any of the nonreducing sugars can be preferably used.

Examples of the trehalose-type oligosaccharide include saccharose and trehalose. Examples of the glycoside include an alkyl glycoside, a phenol glycoside and a mustard oil glycoside.

Examples of the sugar alcohol include D,L-arabitol, ribitol, xylitol, D,L-sorbitol, D,L-mannitol, D,L-iditol, D,L-talitol, dulcitol and allodulcitol. Other preferable examples include maltitol obtained by hydrogenation of disaccharide and a reduced product (reduced starch syrup) obtained by hydrogenation of oligosaccharide.

Among the nonreducing sugars, preferred are a sugar alcohol and saccharose, and more preferred are D-sorbitol, saccharose and reduced starch syrup because of their buffering activity in an appropriate pH region. The nonreducing sugars may be used individually or in combination of two or more thereof A content of the nonreducing sugar in the developer is preferably from 0.1 to 30% by weight, more preferably from 1 to 20% by weight.

In combination with the alkali silicate or nonreducing sugar, an alkali agent appropriately selected from conventionally known alkali agents can be used as the base. Examples of the alkali agent include sodium hydroxide, potassium hydroxide and lithium hydroxide.

Other preferable examples thereof include an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents may be used individually or in combination of two or more thereof. Of the alkali agents, sodium hydroxide and potassium hydroxide are preferred. The reason for this is that a pH of the developer can be adjusted over a wide region by controlling an amount of the alkali agent added with respect to the nonreducing sugar. Also, trisodium phosphate, tripotassium phosphate, sodium carbonate and potassium carbonate are preferred because of their own buffering activity.

The development replenisher for use in the present invention may further contain an electric conductivity adjusting agent. The electric conductivity adjusting agent used in the present invention means a substance having a function of elevating the electric conductivity of the alkaline developer, and any substance may be used as long as it is soluble in an aqueous alkali solution, reacts with none of developer components, development replenisher components, photosensitive layer components, undercoat layer components and backcoat layer components, and exhibits an electrophoretic property when dissolved in water. The electric conductivity adjusting agent includes an organic electrolyte and an inorganic electrolyte.

Among the compounds, the electric conductivity adjusting agent for use in the present invention is preferably a compound capable of elevating the electric conductivity by 2 to 10 mS/cm, preferably by 3 to 8 mS/cm, more preferably by 4 to 7 mS/cm, when the compound is added in a concentration of 0.01 to 10.0% by weight to a developer originally having an electric conductivity of 35 to 80 mS/cm. The electric conductivity adjusting agent is more preferably an inorganic or organic electrolyte satisfying the above-described condition and additionally, having a molecular weight of 1,500 or less, preferably 1,000 or less, more preferably from 100 to 800. The electric conductivity adjusting agent is most preferably a compound exhibiting, in addition to satisfy the conditions regarding the elevation of electric conductivity and molecular weight, a pH of 3 to 10, preferably a pH of 3.5 to 9.5, more preferably a pH of 4 to 9, when the compound is formed into a 5% by weight aqueous solution.

Accordingly, the electric conductivity adjusting agent for use in the present invention is most preferably an inorganic or organic electrolyte (1) which is soluble in an aqueous alkali solution, reacts with none of the developer components, development replenisher components, photosensitive layer components, undercoat layer components and backcoat layer components, and exhibits an electrophoretic property when dissolved in water, (2) which can elevate the electric conductivity by 4 to 7 mS/cm when added in a concentration of 0.01 to 10.0% by weight to a developer originally having an electric conductivity of 35 to 80 mS/cm, (3) which has a molecular weight of 100 to 800, and (4) which exhibits a pH of 4 to 9 when formed into a 5 weight % aqueous solution.

The electric conductivity can be measured, for example, using an electric conductivity meter manufactured by DKK-TOA Corporation.

Specific examples of the electric conductivity adjusting agent for use in the present invention include an inorganic electrolyte, for example, carbonate, bicarbonate, phosphate, phosphite, hydrochloride, sulfate, sulfite, nitrate or nitrite of lithium, sodium, potassium, calcium, magnesium or ammonium, and an organic electrolyte, for example, carboxylate, sulfonate or phosphonate of lithium, sodium, potassium, calcium, magnesium or ammonium.

More specific examples thereof include a carboxylate, for example, formate, acetate, propionate, butanoate, oxalate, malonate, succinate or citrate, an aromatic carboxylate, for example, benzoate, salicylate, sulfosalicylate or phthalate, and a sulfonate, for example, lower alkyl sulfonate, benzenesulfonate, styrenesulfonate, xylenesulfonate, lower alkyl benzenesulfonate or benzenedisulfonate.

In the present invention, the electric conductivity adjusting agents may be used individually or in combination of two or more thereof.

Among the electric conductivity adjusting agents, preferred are potassium citrate, sodium citrate, lithium citrate, potassium succinate, sodium succinate, lithium succinate, potassium carbonate, sodium carbonate and lithium carbonate. A developer comprising an alkali silicate or nonreducing sugar and a base is used as the alkaline developing solution as described above, and $Li^+$, $Na^+$, $K^+$ or $NH_4^+$ is conventionally used as a cation component therein. In particular, a system containing a large amount of cation having a small ionic radius has high penetrability into an image recording layer and excellent developing property, but the system dissolves even the image area to cause image defect. Accordingly, the increase of alkali concentration has a limit to a certain extent and in order to completely perform the processing so as not to remain the image recording layer in the non-image area (residual film) without forming the defects in the image area, delicate setting of liquid conditions is required.

However, when a cation having a large ionic radius is used as the cation component, the developer can be prevented from penetration into the image recording layer and the effect of inhibiting dissolution of the image area can be enhanced without decreasing the alkali concentration, that is, the developing property.

As the cation component, cations other than the above-described alkali metal cation and ammonium ion may be used.

To the alkali developing solution for use in the present invention, an additive described below may be added for the purpose of enhancing the developing performance.

Examples of the additive include a neutral salt, for example, NaCl, KCl or KBr described in JP-A-58-75152, a chelating agent, for example, EDTA or NTA described in JP-A-58-190952, a complex, for example, $[Co(NH_3)_6]Cl_3$ or $CoCl_2.6H_2O$ described in JP-A-59-121336, a anionic or amphoteric surfactant, for example, sodium alkylnaphthalenesulfonate or N-tetradecyl-N,N-dihydroxyethyl betaine described in JP-A-50-51324, a nonionic surfactant, for example, tetramethyldecynediol described in U.S. Pat. No. 4,374,920, a cationic polymer, for example, methyl chloride quaternary compound of p-dimethylaminomethyl polystyrene described in JP-A-55-95946, an amphoteric polymer electrolyte, for example, copolymer of vinylbenzyltrimethylammonium chloride and sodium acrylate described in JP-A-56-142528, a reducing inorganic salt, for example, sodium sulfite described in JP-A-57-192951, an inorganic lithium compound, for example, lithium chloride described in JP-A-58-59444, an organic metal surfactant containing organic Si, Ti or the like described in JP-A-59-75255, an organic boron compound described in JP-A-59-84241, and a quaternary ammonium salt, for example, tetraalkylammonium oxide described in EP-101,010.

The lithographic printing plate precursor subjected to the development processing using an alkaline developing solution and a replenisher is after-treated with washing water, a rinsing solution containing a surfactant or the like, or a desensitizing solution containing gum arabic or a starch derivative. The after-treatment may be performed by variously combining these processing solutions.

A heat-sensitive positive lithographic printing plate precursor for use in the plate-making method of the present invention will be described below. Heat-Sensitive Positive Lithographic Printing Plate Precursor The heat-sensitive positive lithographic printing plate precursor for use in the plate-making method of the present invention comprises a support having provided thereon an image recording layer containing as an essential component, an infrared absorbing dye and usually further containing an alkali-soluble resin and the like.

The heat-sensitive positive lithographic printing plate precursor (hereinafter also referred to as a "lithographic printing plate precursor") is described in detail below. The construction of the image recording layer is described.

Infrared Absorbing Dye

In the present invention, the infrared absorbing dye used for the image recording layer is not particularly limited as long as it is a dye capable of absorbing infrared ray to generate heat, and various dyes known as infrared absorbing dyes can be used.

As for the infrared absorbing dye, commercially available dyes and known dyes described in publications (for example, Senryo Binran (Handbook of Dyes), compiled by Yuki Gosei Kagaku Kyokai (1970)) may be used. Specific examples thereof include dyes, for example, azo dye, metal complex azo dye, pyrazolone azo dye, quinoneimine dye, methine dye and cyanine dye. Among these, dyes capable of absorbing infrared or near infrared ray are preferred in the present invention, because such dyes are suitable for use with a laser emitting infrared or near infrared ray.

Examples of the dye capable of absorbing infrared or near infrared ray include cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Furthermore, near infrared absorbing sensitizers described in U.S. Pat. No. 5,156,938 may also be preferably used as the dye. In particular, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, pyrylium compounds described in JP-B-5-13514 (the term "JP-B" as used herein means an "examined Japanese patent publication") and JP-B-5-19702, and commercially available products, for example, Epolight III-178, Epolight III-130 and Epolight III-125 produced by Epolin Inc. are preferably used.

Particularly preferred examples of the infrared absorbing dye for use in the image recording layer include infrared absorbing dyes represented by formulae (I) and (II) of U.S. Pat. No. 4,756,993. The dye very strongly interacts with an alkali-soluble resin and assures excellent alkali development resistance in the unexposed area of the image recording layer.

The amount of the infrared absorbing dye added to the image recording layer is from 0.01 to 50 by weight, preferably from 0.1 to 50% by weight, more preferably from 0.1 to 30% by weight, based on the weight of the image recording layer in view of sensitivity and uniformity of the image recording layer.

Specific examples of the infrared absorbing dye are set forth below, but the present invention should not be construed as being limited thereto.

Cyanine Dye A:

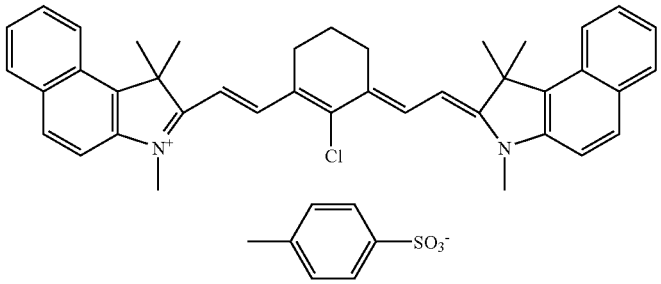

Cyanine Dye B:

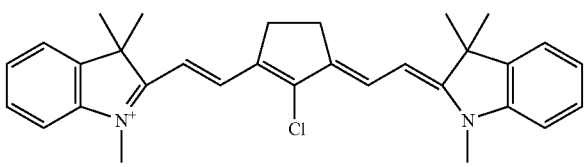

Cyanine Dye C:

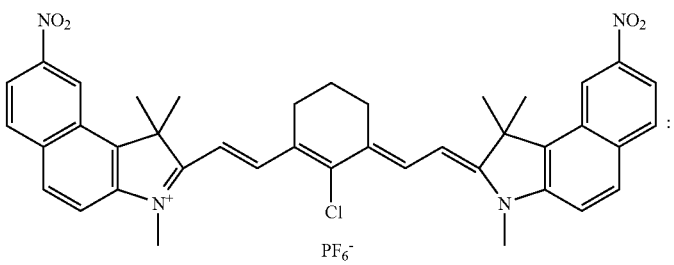

-continued

Cyanine Dye D:

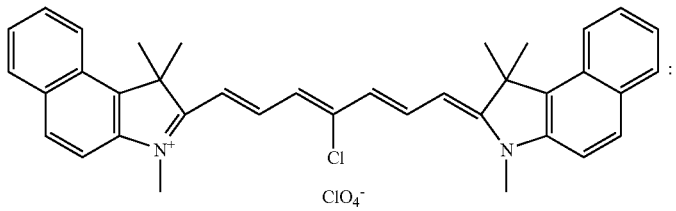

Cyanine Dye E:

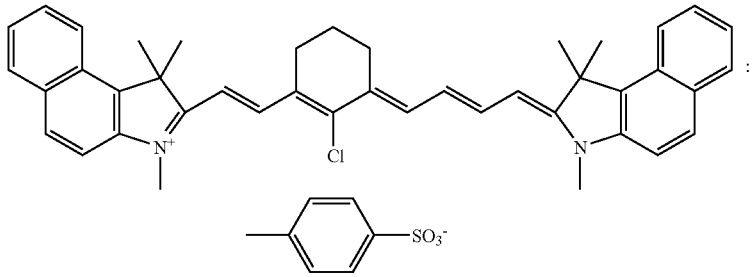

Alkali-Soluble Resin

The alkali-soluble resin for use in the image recording layer is a water-insoluble and alkali water-soluble resin (hereinafter sometimes referred to as an "alkali-soluble polymer") and includes homopolymers containing an acidic group in the main chain and/or side chain thereof, copolymers thereof and mixtures thereof. Accordingly, the image recording layer of the lithographic printing plate precursor has a property of being dissolved when brought into contact with an alkaline developer.

As for the alkali-soluble polymer for use in the image recording layer, hitherto known alkali-soluble polymers are employed without particular limitation, but it is preferably a polymer having any functional group of (1) a phenolic hydroxy group, (2) a sulfonamido group and (3) an active imido group in its molecule. Examples thereof include those described below, but the present invention should not be construed as being limited thereto.

Examples of the polymer compound having (1) a phenolic hydroxy group include a novolak resin, for example, phenol-formaldehyde resin, m-cresol-formaldehyde resin, p-cresol-formaldehyde resin, m-/p-mixed cresol-formaldehyde resin or phenol/(m-, p- or n-/p-mixed) cresol mixed formaldehyde resin, and a pyrogallol acetone resin. In addition, a polymer compound having a phenolic hydroxy group in its side chain is preferably used as the polymer compound having a phenolic hydroxy group. Examples of the polymer compound having a phenolic hydroxy group in the side chain thereof include a polymer compound obtained by homopolymerizing a polymerizable monomer of a low molecular compound having at least one phenolic hydroxy group and at least one polymerizable unsaturated bond, or by copolymerizing the monomer with another polymerizable monomer.

Examples of the polymerizable monomer having a phenolic hydroxy group include an acrylamide, a methacrylamide, an acrylic acid ester and a methacrylic acid ester each having a phenolic hydroxyl group and a hydroxystyrene. Specific preferred examples thereof include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl) ethyl methacrylate, 2-(3-hydroxyphenyl)ethyl methacrylate and 2-(4-hydroxyphenyl)ethyl methacrylate. The resins having a phenolic hydroxy group may be used in combination of two or more thereof. Furthermore, as described in U.S. Pat. No. 4,123,279, a copolymer of formaldehyde and phenol containing as a substituent, an alkyl group having from 3 to 8 carbon atoms, for example, tert-butyl phenol formaldehyde resin or octyl phenol formaldehyde resin, may be used in combination.

Examples of the alkali-soluble polymer compound having (2) a sulfonamido group include a polymer compound obtained by homopolymerizing a polymerizable monomer having a sulfonamido group, or by copolymerizing the monomer with another polymerizable monomer. Examples of the polymerizable monomer having a sulfonamido group include a polymerizable monomer of a low molecular compound having at least one polymerizable unsaturated bond and at least one sulfonamido group where at least one hydrogen atom is bonded on the nitrogen atom (—NH—SO$_2$—) per molecule. Among these, preferred are low molecular compounds having an acryloyl, aryl or vinyloxy group and an unsubstituted or mono-substituted aminosulfonyl group or a substituted sulfonylimino group.

The alkali-soluble polymer compound having (3) an active imido group is preferably a polymer compound having an active imido group in its molecule, and examples of the polymer compound include a polymer compound obtained by homopolymerizing a polymerizable monomer of a low molecular compound having at least one active imido group and at least one polymerizable unsaturated bond per molecule, or by copolymerizing the monomer with another polymerizable monomer.

Specific examples of the polymer compound which can be preferably used include N-(p-toluenesulfonyl)methacrylamide and N-(p-toluenesulfonyl)acrylamide.

The alkali-soluble polymer compound is preferably a polymer compound obtained by polymerizing two or more of the above-described polymerizable monomers having a phenolic hydroxy group, polymerizable monomers having a sulfonamido group and polymerizable monomers having an active imido group, or a polymer compound obtained by copolymerizing two or more of these polymerizable monomers with another polymerizable monomer. In the case of copolymerizing a polymerizable monomer having a phenolic hydroxy group with a polymerizable monomer having a sulfonamido group and/or a polymerizable monomer having an active imido group, a weight ratio of the components blended is preferably from 50:50 to 5:95, more preferably from 40:60 to 10:90.

In the case where the alkali-soluble polymer is a copolymer of the above-described polymerizable monomer having a phenolic hydroxy group, a sulfonamido group or an active imido group with another polymerizable monomer, the copolymer preferably contains 10% by mole or more, more preferably 20% by mole or more, of the monomer of imparting alkali solubility so as to ensure sufficiently high alkali solubility and to satisfactorily achieve the effect of enhancing the developing latitude.

Examples of the monomer component that is copolymerized with the polymerizable monomer having a phenolic hydroxy group, polymerizable monomer having a sulfonamido group or polymerizable monomer having an active imido group include the compounds shown in (m1) to (m12) below, but the present invention should not be construed as being limited thereto.

(m1) Acrylic acid esters and methacrylic acid esters each having an aliphatic hydroxy group, for example, 2-hydroxyethyl acrylate or 2-hydroxyethyl methacrylate.

(m2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate or glycidyl acrylate.

(m3) Alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate or glycidyl methacrylate.

(m4) Acrylamides and methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(m5) Vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether.

(m6) Vinyl esters, for example, vinyl acetate, vinyl chloroacetate, vinyl butyrate or vinyl benzoate.

(m7) Styrenes, for example, styrene, a-methylstyrene, methylstyrene or chloromethylstyrene.

(m8) Vinyl ketones, for example, methyl vinyl ketone, ethyl vinyl ketone, propyl vinyl ketone or phenyl vinyl ketone.

(m9) Olefins, for example, ethylene, propylene, isobutylene, butadiene or isoprene.

(m10) N-Vinylpyrrolidone, acrylonitrile, methacrylonitrile or the like.

(m11) Unsaturated imides, for example, maleimide, N-acryloylacrylamide, N-acetylmethacrylamide, N-propionylmethacrylamide or N-(p-chlorobenzoyl)methacrylamide.

(m12) Unsaturated carboxylic acids, for example, acrylic acid, methacrylic acid, maleic anhydride or itaconic acid.

The alkali-soluble polymer compound preferably has a phenolic hydroxy group because of excellent image forming property upon exposure with an infrared laser or the like. Preferred examples thereof include a novolak resin, for example, phenol-formaldehyde resin, in-cresol-formaldehyde resin, p-cresol-formaldehyde resin, m-/p-mixed cresol-formaldehyde resin or phenol/(m-, p- or m-/p-mixed) cresol mixed formaldehyde resin, and a pyrogallol acetone resin.

Other examples of the alkali-soluble polymer compound having a phenolic hydroxy group include condensation polymerization products of formaldehyde and phenol containing as a substituent, an alkyl group having from 3 to 8 carbon atoms, for example, tert-butyl phenol formaldehyde resin and octyl phenol formaldehyde resin, described in U.S. Pat. No. 4,123,279.

With respect to the method for copolymerization of the alkali-soluble polymer compound, a conventionally known method, for example, graft copolymerization, block copolymerization or random copolymerization can be used.

In the present invention, when the alkali-soluble polymer is a homopolymer or copolymer of the above-described polymerizable monomer having a phenolic hydroxy group, polymerizable monomer having a sulfonamidoe group or polymerizable monomer having an active imido group, the polymer preferably has a weight average molecular weight of 2,000 or more and a number average molecular weight of 500 or more, more preferably a weight average molecular weight of 5,000 to 300,000, a number average molecular weight of 800 to 250,000 and a dispersity (weight average molecular weight/number average molecular weight) of 1.1 to 10.

Also, in the present invention, when the alkali-soluble polymer is a resin, for example, phenol-formaldehyde resin or cresol-aldehyde resin, the polymer preferably has a weight average molecular weight of 500 to 20,000 and a number average molecular weight of 200 to 10,000.

The alkali-soluble polymer compounds may be used individually or in combination of two or more thereof. An amount of the alkali-soluble polymer compound added is from 30 to 99% by weight, preferably from 40 to 95% by weight, more preferably from 50 to 90% by weight, based on the total solid content in the image recording layer. The amount in the range described above is preferred from both aspects of durability and sensitivity of the image recording layer.

The image recording layer may also contain an alkali-soluble polymer compound having a carboxy group (hereinafter sometimes referred to as a "component (B1)").

The polymer compound as the component (B1) may be any compound as long as it is an alkali-soluble polymer compound having a carboxy group, but polymer compounds (b1-1) and (b1-2) described below are preferred.

(b1-1) Alkali-Soluble Polymer. Compound Having Polymerizable Monomer Unit Represented by Formula (i) (hereinafter sometimes referred to as a "polymer compound (b1-1)")

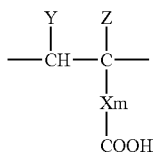

(wherein Xm represents a single bond or a divalent linking group, Y represents a hydrogen atom or a carboxy group, and Z represents a hydrogen atom, an alkyl group or a carboxy group).

A monomer constituting the polymerizable monomer unit represented by formula (i) includes a polymerizable monomer containing at least one carboxy group and at least one polymerizable unsaturated group in its molecule.

Specific examples of such a polymerizable monomer include an α,β-unsaturated carboxylic acid, for example, acrylic acid, methacrylic acid, maleic acid, maleic anhydride, itaconic acid or itaconic anhydride.

Examples of a monomer, which is copolymerized with the above-described polymerizable monomer having a carboxy group, include the compounds shown in (1) to (11) below, but the present invention should not be construed as being limited thereto.

(1) Acrylic acid esters and methacrylic acid esters each having an aliphatic hydroxy group, for example, 2-hydroxyethyl acrylate or 2-hydroxyethyl methacrylate.

(2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate or N-dimethylaminoethyl acrylate.

(3) Alkyl methacrylates, for example, methyl methacrylate, ethyl methacrylate, propyl methacrylate, butyl methacrylate, amyl metbacrylate, hexyl methacrylate, cyclohexyl methacrylate, benzyl methacrylate, 2-chloroethyl methacrylate, glycidyl methacrylate or N-dimethylaminoethyl methacrylate.

(4) Acrylamides and methacrylarmides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(5) Vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether.

(6) Vinyl esters, for example, vinyl acetate, vinyl chloroacetate, vinyl butyrate or vinyl benzoate.

(7) Styrenes, for example, styrene, a-methylstyrene, methylstyrene or chloromethylstyrene.

(8) Vinyl ketones, for example, methyl vinyl ketone, ethyl vinyl ketone, propyl vinyl ketone or phenyl vinyl ketone.

(9) Olefins, for example, ethylene, propylene, isobutylene, butadiene or isoprene.

(10) N-Vinylpyrrolidone, N-vinylcarbazole, 4-vinylpyridine, acrylonitrile, methacrylonitrile or the like.

(11) Unsaturated imides, for example, maleimide, N-acryloylacrylamide, N-acetylmethacrylamide, N-propionylmethacrylamide or N-(p-chlorobenzoyl)methacrylamide.

A monomer represented by the following formula (ii) is also preferably used.

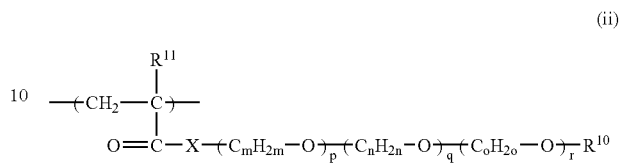

wherein X represents O, S or $N-R^{12}$, $R^{10}$ to $R^{12}$ each independently represents a hydrogen atom or an alkyl group, m, n and o each independently represents an integer of 2 to 5, $C_mH_{2m}$, $C_nH_{2n}$ and $C_oH_{2o}$ each may be a straight chain or a branched structure, p, q and r each independently represents an integer of 0 to 3,000, provided that $p+q+r \geq 2$.

The alkyl group represented by any one of $R^{10}$ to $R^{12}$ is preferably an alkyl group having from 1 to 12 carbon atoms, and specific examples thereof include a methyl group, an ethyl group, an n-propyl group and an isopropyl group. p, q and r each preferably represents an integer of 0 to 500, more preferably an integer of 0 to 100.

Examples of a monomer corresponding to the repeating unit represented by formula (ii) are set forth below, but the present invention should not be construed as being limited thereto.

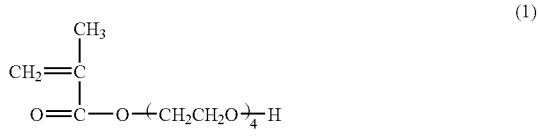

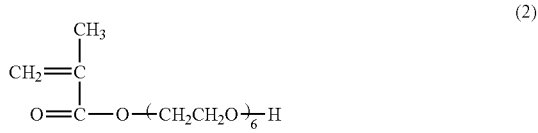

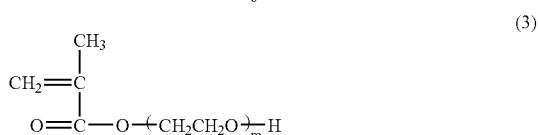

(average molecular weight of alkylene oxide: 1,000)

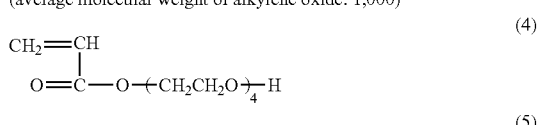

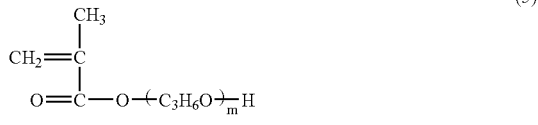

(average molecular weight of alkylene oxide: 1,000)

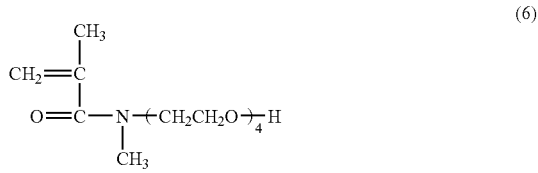

-continued $$CH_2=\underset{CH_3}{\overset{}{C}}-\underset{O}{\overset{}{C}}-O-(CH_2CH_2O)_4-(C_3H_6O)_8-(CH_2CH_2O)_4-H \quad (7)$$

$$CH_2=\underset{CH_3}{\overset{}{C}}-\underset{O}{\overset{}{C}}-O-(C_3H_6O)_2-(CH_2CH_2O)_{10}-(C_3H_6O)_3-H \quad (8)$$

$$CH_2=\underset{CH_3}{\overset{}{C}}-\underset{O}{\overset{}{C}}-O-(CH_2CH_2O)_6-H \quad (9)$$

$$CH_2=\underset{CH_3}{\overset{}{C}}-\underset{O}{\overset{}{C}}-O-(CH_2CH_2O)_m-H \quad (10)$$

(average molecular weight of alkylene oxide: 500)

$$CH_2=\underset{CH_3}{\overset{}{C}}-\underset{O}{\overset{}{C}}-O-(CH_2CH_2O)_m-H \quad (11)$$

(average molecular weight of alkylene oxide: 2,000)

$$CH_2=CH-\underset{O}{\overset{}{C}}-O-(CH_2CH_2O)_6-H \quad (12)$$

$$CH_2=CH-\underset{O}{\overset{}{C}}-O-(CH_3CH_6O)_m-H \quad (13)$$

(average molecular weight of alkylene oxide: 1,500)

$$CH_2=\underset{CH_3}{\overset{}{C}}-\underset{O}{\overset{}{C}}-S-(CH_2CH_2O)_4-H \quad (14)$$

The monomer corresponding to the repeating unit represented by formula (ii) can be produced by reacting a commercially available hydroxypoly(oxyalkylene) material, for example, a material available under a trade name of Pluronic (produced by Asahi Denka Co., Ltd.), Adeka Polyether (produced by Asahi Denka Co., Ltd.), Carbowax (produced by Glico Products), Toriton (produced by Rohm and Haas Co.) or P.E.G (produced by Dai-Ichi Kogyo Seiyaku Co., Ltd.), with acrylic acid, methacrylic acid, acryl chloride, methacryl chloride, acrylic anhydride or the like according to a known method.

Further, poly(oxyalkylene) diacrylate produced by a known method may also be used.

Examples of the commercially available monomer include hydroxy group-terminated polyalkylene glycol mono(meth)acrylates produced by NOF Corp., for example, Blemmer PE-90, Blemmer PE-200, Blemmer PE-350, Blemmer AE-90, Blemmer AE-200, Blemmer AE-400, Blemmer PP-1000, Blemmer PP-500, Blemmer PP-800, Blemmer AP-150, Blemmer AP-400, Blemmer AP-550, Blemmer AP-800, Blemmer 50 PEP-300, Blemmer 70 PEP-350B, Blemmer AEP Series, Blemmer 55 PET-400, Blemmer 30 PET-800, Blemmer 55 PET-800, Blemmer AET Series, Blemmer 30 PPT-800, Blemmer 50 PPT-800, Blemmer 70 PPT-800, Blemmer APT Series, Blemmer 10 PPB-500B and Blemmer 10 APB-500B; alkyl-terminated polyalkylene glycol mono(meth)acrylates produced by NOF Corp., for example, Blemmer PME-100, Blemmer PME-200, Blemmer PME-400, Blemmer PME-1000, Blemmer PME-4000, Blemmer AME-400, Blemmer 50 POEP-800B, Blemmer 50 AOEP-800B, Blemmer PLE-200, Blemmer ALE-200, Blemmer ALE-800, Blemmer PSE-400, Blemmer PSE-1300, Blemmer ASEP Series, Blemmer PKEP Series, Blemmer AKEP Series, Blemmer ANE-300, Blemmer ANE-1300, Blemmer PNEP Series, Blemmer PNPE Series, Blemmer 43 ANEP-500, Blemmer 70 ANEP-550; and monomers produced by Kyoeisha Chemical Co., Ltd., for example, Light Ester MC, Light Ester 130MA, Light Ester 041MA, Light Acrylate BO-A, Light Acrylate EC-A, Light Acrylate MTG-A, Light Acrylate 130A, Light Acrylate DPM-A, Light Acrylate P-200A, Light Acrylate NP-4EA and Light Acrylate NP-8EA.

In the polymer compound (b1-1), the minimum constituent unit comprising the polymerizable monomer component having at least one carboxy group and at least one polymerizable unsaturated group in the molecule thereof is not particularly limited to only one species, and a copolymer obtained by copolymerizing two or more minimum constituent units having the same acidic group or a copolymer obtained by copolymerizing two or more minimum constituent units differing in the acidic group contained therein may be used.

With respect to the method for copolymerization, a conventionally known method, for example, graft copolymerization, block copolymerization and random copolymerization can be used.

(b1-2) Carboxyl Group-Containing Alkali-Soluble Polymer Compound Including as Basic Skeleton, Reaction Product of Diol Compound Having Carboxy Group Represented by Formula (iii), (iv) or (v) and Diisocyanate Compound Represented by Formula (viii) (hereinafter sometimes referred to as a "polymer compound (b1-2)")

$$HO-R^{14}-\underset{\underset{COOH}{|}}{\overset{\underset{R^{13}}{|}}{C}}-R^{15}-OH \quad (iii)$$

$$HO-R^{14}-\underset{\underset{COOH}{|}}{\overset{}{Ar}}-R^{15}-OH \quad (iv)$$

$$HO-R^{14}-\underset{\underset{COOH}{|}}{\overset{}{N}}-R^{15}-OH \quad (v)$$

In the formulae, $R^{13}$ represents a hydrogen atom or an alkyl, alkenyl, aralkyl, aryl, alkoxy or aryloxy group which may have a substituent (preferably including, for example, an alkyl group, an aryl group, an alkoxy group, an ester group, a urethane group, an amido group, a ureido group or a halogeno group), and preferably represents a hydrogen atom, an alkyl group having from 1 to 8 carbon atoms, an alkenyl group having from 2 to 8 carbon atoms or an aryl group having from 6 to 15 carbon atoms.

$R^{14}$, $R^{15}$ and $R^{16}$, which may be the same or different, each represents a single bond or a divalent aliphatic or aromatic hydrocarbon group which may have a substituent (preferably including, for example, an alkyl group, an alkenyl group, an aralkyl group, an aryl group, an alkoxy group or a halogeno group), preferably represents an alkylene group having from 1 to 20 carbon atoms or an arylene group having 6 to 15 carbon atoms, and more preferably represents an alkylene group having from 1 to 8 carbon atoms.

If desired, $R^{14}$, $R^{15}$ and $R^{16}$ each may contain another functional group that does not react with the isocyanate group, for example, an ester group, a urethane group, an amido group, a ureido group or a carbon-carbon unsaturated bond. Two or three of $R^{13}$, $R^{14}$, $R^{15}$ and $R^{16}$ may form a ring.

Ar represents a trivalent aromatic hydrocarbon group which may have a substituent, and preferably represents an aromatic group having from 6 to 15 carbon atoms.

$$OCN-R^{18}-NCO \quad \quad (viii)$$

wherein $R^{18}$ represents a divalent aliphatic or aromatic hydrocarbon group which may have a substituent (preferably including, for example, an alkyl group, an alkenyl group, an aralkyl group, an aryl group, an alkoxy group or a halogeno group). If desired, $R^{18}$ may contain another functional group that does not react with the isocyanate group, for example, an ester group, a urethane group, an amido group, a ureido group or a carbon-carbon unsaturated bond.

Specific examples of the diol compound having a carboxy group represented by formulae (iii), (iv) or (v) include:

3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid and N,N-bis(2-hydroxyethyl)-3-carboxypropionamide.

The carboxyl group-containing alkali-soluble polymer compound (b1-2) is preferably a reaction product combined with a diol represented by the following formula (vi) or (vii):

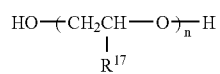

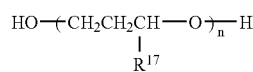

wherein each $R^{17}$ represents a hydrogen atom or an alkyl group having from 1 to 8 carbon atoms, and n represents an integer of 2 or more. Examples of the alkyl group having from 1 to 8 carbon atoms for $R^{17}$ include a methyl group, an ethyl group, an isopropyl group, an n-butyl group and an isobutyl group.

Specific examples of the diol represented by formula (vi) or (vii) are set forth below, but the present invention should not be construed as being limited thereto.

Specific examples of (vi):
HO—(—CH$_2$CH$_2$O—)$_3$—H
HO—(—CH$_2$CH$_2$O—)$_4$—H
HO—(—CH$_2$CH$_2$O—)$_5$—H
HO—(—CH$_2$CH$_2$O—)$_6$—H
HO—(—CH$_2$CH$_2$O—)$_7$—H
HO—(—CH$_2$CH$_2$O—)$_8$—H
HO—(—CH$_2$CH$_2$O—)$_{10}$—H
HO—(—CH$_2$CH$_2$O—)$_{12}$—H
Polyethylene glycol (average molecular weight: 1,000)
Polyethylene glycol (average molecular weight: 2,000)
Polyethylene glycol (average molecular weight: 4,000)
HO—(—CH$_2$CH(CH$_3$)O—)$_3$—H
HO—(—CH$_2$CH(CH$_3$)O—)$_4$—H
HO—(—CH$_2$CH(CH$_3$)O—)$_6$—H
Polypropylene glycol (average molecular weight: 1,000)
Polypropylene glycol (average molecular weight: 2,000)
Polypropylene glycol (average molecular weight: 4,000)

Specific examples of (vii):
HO—(—CH$_2$CH$_2$CH$_2$O—)$_3$—H
HO—(—CH$_2$CH$_2$CH$_2$O—)$_4$—H
HO—(—CH$_2$CH$_2$CH$_2$O—)$_8$—H
HO—(—CH$_2$CH$_2$CH(CH$_3$)O—)$_{12}$—H Specific examples of the diisocyanate compound represented by formula (viii) include:

aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenyl methane diisocyanate, 1,5-naphthalene diisocyanate or 3,3'-dimethylbiphenyl-4,4'-diisocyanate; aliphatic diisocyanate compound, for example, hexamethylene diisocyanate, trimethylhexamethylene diisocyanate, lysine diisocyanate or dimeric acid diisocyanate; aliphatic diisocyanate compound, for example, isophorone diisocyanate, 4,4'-methylenebis(cyclohexyl isocyanate), methylcyclohexane-2,4(or 2,6)-diisocyanate or 1,3-(isocyanatomethyl)cyclohexane; and diisocyanate compound obtained by a reaction of diol with diisocyanate, for example, an adduct of 1 mol of 1,3-butylene glycol and 2 mol of tolylene diisocyanate.

A molar ratio of the diisocyanate and the diol compound used for synthesis of the polymer compound (b1-2) is preferably from 0.8:1 to 1.2 to 1, and when an isocyanate group is remaining at the polymer terminal, such a compound is treated with an alcohol or an amine so that a compound having no residual isocyanate group can be finally synthesized.

In the component (B1), one compound selected from the polymer compounds (b1-1) and (b1-2) may be used alone, or two or more thereof may be used in combination.

A content of the carboxyl group-containing repeating unit contained in the component (B1) is 2% by mole or more, preferably from 2 to 70% by mole, more preferably from 5 to 60% by mole, based on the total amount of respective monomers in the component (B1).

A weight average molecular weight of the component (B1) is preferably from 3,000 to 300,000, more preferably from 6,000 to 100,000.

An amount of the component (B1) added is preferably from 0.005 to 80% by weight, more preferably from 0.01 to 50% by weight, still more preferably from 1 to 20% by weight, based on the total solid content of the image recording layer.

Additives

In the formation of the image recording layer, various additives may be added, if desired, in addition to the above-described components as long as the effects of the present invention are not impaired.

Solubility Inhibiting Compound

In the lithographic printing plate precursor, various inhibitors may be incorporated into the image recording layer in order to enhance the inhibition (solubility inhibition).

The inhibitor is not particularly limited, and examples thereof include a quaternary ammonium salt and a polyethylene glycol-based compound.

The quaternary ammonium salt is not particularly limited, and examples thereof include tetraalkylammonium salts, trialkylarylammonium salts, dialkyldiarylammonium salts, alkyltriarylammonium salts, tetraarylammonium salts, cyclic ammonium salts and dicyclic ammonium salts.

Specific examples thereof include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyl-trimethylammonium bromide and N-methylpyridinium bromide. In particular, quaternary ammonium salts described in Japanese Patent Application Nos. 2001-226297, 2001-370059 and 2001-398047 are preferred.

An amount of the quaternary ammonium salt added is preferably from 0.1 to 50% by weight, more preferably from 1 to 30% by weight, based on the total solid content of the image recording layer. The amount in the range is appropriate from the standpoint that a sufficiently high solubility inhibiting effect is achieved and the film-forming property of binder is not deteriorated.

The polyethylene glycol-based compound is not particularly limited, and examples thereof include those having the following structure:

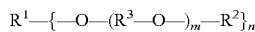

wherein $R^1$ represents a polyhydric alcohol residue or a polyhydric phenol residue, $R^2$ represents a hydrogen atom or an alkyl, alkenyl, alkynyl, alkyloyl, aryl or aryloyl group having from 1 to 25 carbon atoms, which may have a substituent, $R^3$ represents an alkylene residue, which may have a substituent, m represents an integer of 10 or more on average, and n represents an integer of 1 to 4.

Examples of the polyethylene glycol-based compound having the structure shown above include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycolated ethylenediamines, polypropylene glycolated ethylenediamines, polyethylene glycolated diethylenetriamines and polypropylene glycolated diethylenetriamines.

Specific examples thereof include polyethylene glycol 1000, polyethylene glycol 2000, polyethylene glycol 4000, polyethylene glycol 10000, polyethylene glycol 20000, polyethylene glycol 5000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic acid ester, polyethylene glycol lauryl ester, polyethylene glycol dilauryl ester, polyethylene glycol nonylic acid ester, polyethylene glycol cetylic acid ester, polyethylene glycol stearoyl ester, polyethylene glycol distearoyl ester, polyethylene glycol behenic acid ester, polyethylene glycol dibehenic acid ester, polypropylene glycol acetyl ester, polypropylene glycol diacetyl ester, polypropylene glycol benzoic acid ester, polypropylene glycol dibenzoic acid ester, polypropylene glycol lauric acid ester, polypropylene glycol dilauric acid ester, polypropylene glycol nonylic acid ester, polyethylene glycol glycerin ether, polypropylene glycol glycerin ether, polyethylene glycol sorbitol ether, polypropylene glycol sorbitol ether, polyethylene glycolated ethylenediamine, polypropylene glycolated ethylenediamine, polyethylene glycolated diethylenetriamine, polypropylene glycolated diethylenetriamine and polyethylene glycolated pentamethylenehexamine.

An amount of the polyethylene glycol-based compound added is preferably from 0.1 to 50% by weight, more preferably from 1 to 30% by weight, based on the total solid content of the image recording layer in view of exerting a sufficiently high solubility inhibiting effect and maintaining good image forming property.

When the above-described measure for enhancing the inhibition (solubility inhibition) is implemented, the sensitivity may decrease. In such a case, addition of a lactone compound is effective. It is believed that when a developer penetrates into the exposed area, the lactone compound reacts with the developer to newly generate a carboxylic acid compound, thereby contributing to dissolution of the exposed area to increase the sensitivity.

The lactone compound is not particularly limited, and examples thereof include the compounds represented by the following formulae (L-I) and (L-II):

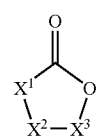

(L-I)

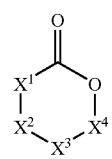

(L-II)

In formulae (L-I) and (L-II), $X^1$, $X^2$, $X^3$ and $X^4$, which may be the same or different, each represents a constituent atom or atomic group for the ring and each independently may have a substituent, provided that at least one $X^1$, $X^2$ and $X^3$ in formula (L-I) or at least one $X^1$, $X^2$, $X^3$ and $X^4$ in formula (L-II) has an electron-withdrawing substituent or a substituent substituted by an electron-withdrawing group.

The constituent atom or atomic group for the ring represented by $X^1$, $X^2$, $X^3$ and $X^4$ is a nonmetallic atom having two single bonds for forming the ring or an atomic group containing the nonmetallic atom.

The nonmetallic atom or nonmetallic atom group is preferably an atom or atomic group selected from a methylene group, a sulfinyl group, a carbonyl group, a thiocarbonyl group, a sulfonyl group, a sulfur atom, an oxygen atom and a selenium atom, more preferably an atomic group selected from a methylene group, a carbonyl group and a sulfonyl group.

At least one of $X^1$, $X^2$ and $X^3$ in formula (L-I) or at least one of $X^1$, $X^2$, $X^3$ and $X^4$ in formula (L-II) has an electron-withdrawing group. The electron-withdrawing group as used in the present invention indicates a group where the Hammett's substituent constant σp takes a positive value. The Hammett's substituent constant is described, for example, in Journal of Medicinal Chemistry, Vol. 16, No. 11, 1207–1216 (1973). Examples of the electron-withdrawing group where the Hammett's substituent constant σp takes a positive value include a halogen atom. (e.g., fluorine (σp value: 0.06), chlorine (σp value: 0.23), bromine (σp value: 0.23), iodine (σp value: 0.18)), a trihaloalkyl group (e.g., tribromomethyl (σp value: 0.29), trichloromethyl (σp value: 0.33), trifluoromethyl (σp value: 0.54)), a cyano group (σp value: 0.66), a nitro group (σp value: 0.78), an aliphatic, aryl or heterocyclic sulfonyl group (e.g., methanesulfonyl (σp value: 0.72)), an aliphatic, aryl or heterocyclic acyl group (e.g., acetyl (σp value: 0.50), benzoyl (σp value: 0.43)), an alkynyl group (e.g., C≡CH (σp value: 0.23)), an aliphatic, aryl or heterocyclic oxycarbonyl group (e.g., methoxycarbonyl (σp value: 0.45), phenoxycarbonyl (σp value: 0.44)), a carbamoyl group (σp value: 0.36), a sulfamoyl group (σp value: 0.57), a sulfoxido group, a heterocyclic group, an oxo group and a phosphoryl group.

The electron-withdrawing group is preferably a group selected from an amido group, an azo group, a nitro group, a fluoroalkyl group having from 1 to 5 carbon atoms, a nitrile group, an alkoxycarbonyl group having from 1 to 5 carbon atoms, an acyl group having from 1 to 5 carbon atoms, an alkylsulfonyl group having from 1 to 9 carbon atoms, an arylsulfonyl group having from 6 to 9 carbon atoms, an alkylsulfinyl group having from 1 to 9 carbon atoms, an arylsulfinyl group having from 6 to 9 carbon atoms, an arylcarbonyl group having from 6 to 9 carbon atoms, a thiocarbonyl group, a fluorine-containing alkyl group having from 1 to 9 carbon atoms, a fluorine-containing aryl group having from 6 to 9 carbon atoms, a fluorine-containing allyl group having from 3 to 9 carbon atoms, an oxo group and a halogen atom.

The electron-withdrawing group is more preferably a group selected from a nitro group, a fluoroalkyl group having from 1 to 5 carbon atoms, a nitrile group, an alkoxycarbonyl group having from 1 to 5 carbon atoms, an acyl group having from 1 to 5 carbon atoms, an arylsulfonyl group having from 6 to 9 carbon atoms, an arylcarbonyl group having from 6 to 9 carbon atoms, an oxo group and a halogen atom.

Specific examples of the compound represented by formulae (L-1) or (L-II) are set forth below, but the present invention is should not be construed as being limited thereto.

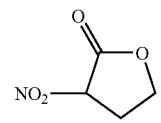 (LI-1)

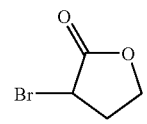 (LI-2)

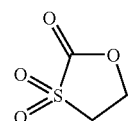 (LI-3)

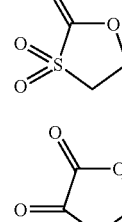 (LI-4)

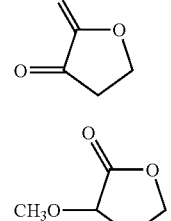 (LI-5)

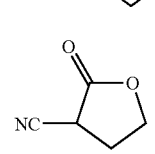 (LI-6)

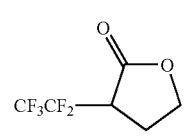 (LI-7)

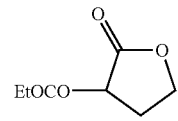 (LI-8)

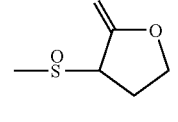 (LI-9)

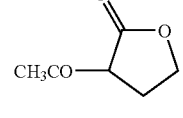 (LI-10)

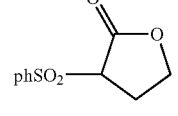 (LI-11)

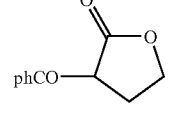 (LI-12)

-continued (LI-13) 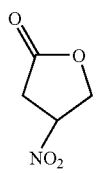

(LI-14) 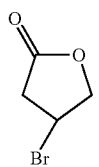

(LI-15) 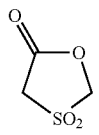

(LI-16) 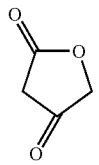

(LI-17) 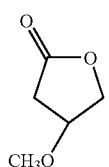

(LI-18) 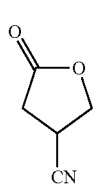

(LI-19) 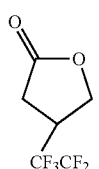

(LI-20) 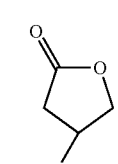

(LI-21) 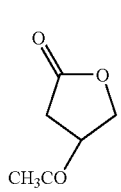

(LI-22) 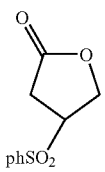

(LI-23) 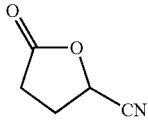

(LI-24) 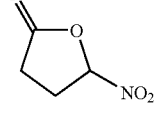

(LII-1) 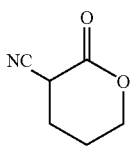

(LII-2) 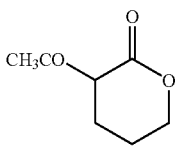

An amount of the compound represented by formula (L-I) or (L-II) added is preferably from 0.1 to 50% by weight, more preferably from 1 to 30% by weight, based on the total solid content of the image recording layer. Since the compound reacts with the developer, it is preferred to selectively contact the compound with the developer.

The lactone compounds may be used individually or in combination of two or more thereof. Also, two or more compounds of formula (L-I) or two or more compounds of formula (L-II) may be used in combination at an appropriate ratio to give the total amount thereof in the above-described range.

Also, a thermally decomposable substance, which substantially decreases the solubility of the alkali water-soluble polymer compound before the thermal decomposition, for example, an onium salt, an o-quinonediazide compound, an aromatic sulfone compound or an aromatic sulfonic acid ester compound, is preferably used in combination from the standpoint of enhancing the solubility inhibition of the image area in the developer. Examples of the onium salt include a diazonium salt, an ammonium salt, a phosphonium salt, an iodonium salt, a sulfonium salt, a selenonium salt and an arsonium salt.

Preferable examples of the onium salt for use in the present invention include diazonium salts described in S. I. Schlesinger, Photogr. Sci. Eng., 18, 387 (1974), T. S. Bal et al., Polymer, 21, 423 (1980) and JP-A-5-158230; ammonium salts described in U.S. Pat. Nos. 4,069,055 and 4,069,056 and JP-A-3-140140; phosphonium salts described in D. C. Necker et al., Macromolecules, 17, 2468 (1984), C. S. Wen et al., Teh, Proc. Conf. Rad. Curing ASIA, p. 478, Tokyo (October, 1988), U.S. Pat. Nos. 4,069,055 and 4,069,056; iodonium salts described in J. V. Crivello et al., Macromolecules, 10 (6), 1307 (1977), Chem. & Eng. News, Nov. 28, page 31 (1988), European Patent 104,143, U.S. Pat. Nos. 339,049 and 410,201, JP-A-2-150848 and JP-A-2-296514; sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 233,567, 297,443 and 297,442, U.S. Pat. Nos. 4,933,377, 3,902,114, 410,201, 339,049, 4,760,013, 4,734,444 and 2,833,827 and German Patents 2,904,626, 3,604,580 and 3,604,581; selenonium salts described in J. V. Crivello et al., Macromolecules, 10 (6), 1307 (1977) and J. V. Crivello et al., J. Polymer Sci., Polymer Chem. Ed., 17, 1047 (1979); and arsonium salts described in C. S. Wen et al., Teh. Proc. nf. Rad. Curing ASIA, p. 478, Tokyo (October, 1988).

Among the onium salts, diazonium salts are preferred. Particularly preferred examples of the diazonium salt include those described in JP-A-5-158230.

Examples of the counter ion for the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and p-toluenesulfonic acid. Among these, preferred are hexafluorophosphoric acid and an alkyl aromatic sulfonic acid, for example, triisopropylnaphthalenesulfonic acid or 2,5-dimethylbenzenesulfonic acid.

Preferable examples of the quinonediazide include an o-quinonediazide compound. The o-quinonediazide compound for use in the present invention is a compound having at least one o-quinonediazide group and capable of increasing the alkali-solubility through thermal decomposition, and compounds having various structures can be used. Specifically, upon thermal decomposition, the o-quinonediazide loses the ability of inhibiting the dissolution of binder and the o-quinonediazide itself is converted into an alkali-soluble substance. By virtue of these two effects, the solubility of the photosensitive system is improved. Examples of the o-quinonediazide compound usable in the present invention include compounds described in J. Kosar, Light-Sensitive Systems, John Wiley & Sons Inc., pp. 339–352, and in particular, sulfonic acid esters or sulfonic acid amides of o-quinonediazide obtained by reaction with various aromatic polyhydroxy compounds or aromatic amino compounds are preferred. In addition, esters of benzoquinone-(1,2)-diazidesulfonic acid chloride or naphthoquinone-(1,2)-diazide-5-sulfonic acid chloride with pyrogallol-acetone resin described in JP-B-43-28403, and esters of benzoquinone-(1,2)-diazidesulfonic acid chloride or naphthoquinone-(1,2)-diazide-5-sulfonic acid chloride with phenol-formaldehyde resin described in U.S. Pat. Nos. 3,046,120 and 3,188,210 may also be preferably used.

Furthermore, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin may also be preferably used. Other useful examples of the o-quinonediazide compound include those described in a large number of patents, for example, JP-A-47-5303, JP-A-48-63802, JP-A-48-63803, JP-A-48-96575, JP-A-49-38701 and JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932 and German Patent 854,890.

An amount of the o-quinonediazide compound added is preferably from 1 to 50% by weight, more preferably from 5 to 30% by weight, still more preferably from 10 to 30% by weight, based on the total solid content of the image recording layer. The o-quinonediazide compounds may be used individually or as a mixture of two or more thereof.

Also, at least partially esterified alkali-soluble resin described in JP-A-11-288089 may be contained.

Furthermore, for the purpose of enhancing the dissolution inhibiting property of the image recording layer and elevating the resistance against scratch on the surface thereof, it is preferred to use in combination a polymer comprising as a polymerization component, a (meth)acrylate monomer containing two or three perfluoroalkyl groups having from 3 to 20 carbon atoms in its molecule described in JP-A-2000-187318. An amount of the polymer added is preferably from 0.1 to 10% by weight, more preferably from 0.5 to 5% by weight, based on the total solid content of the image recording layer.

Development Accelerator

In order to more increase the sensitivity, an acid anhydride, a phenol or an organic acid may also be used in combination.

The acid anhydride is preferably a cyclic acid anhydride, and specific examples of the cyclic acid anhydride which can be used include phthalic anhydride, tetrahydrophthalic anhydride, hexahydrophthalic anhydride, 3,6-endooxy-tetrahydrophthalic anhydride, tetraclorophthalic anhydride, maleic anhydride, chloromaleic anhydride, α-phenylmaleic anhydride, succinic anhydride and pyromellitic anhydride described in U.S. Pat. No. 4,115,128. Examples of a non-cyclic acid anhydride includes acetic anhydride.

Examples of the phenol include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acid include a sulfonic acid, a sulfinic acid, an alkylsulfuric acid, a phosphonic acid, a phosphoric acid ester and a carboxylic acid described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

A content of the acid anhydride, phenol and organic acid in the image recording layer is preferably from 0.05 to 20% by weight, more preferably from 0.1 to 15% by weight, still more preferably from 0.1 to 10% by weight.

Surfactant

To the image recording layer, nonionic surfactants described in JP-A-62-251740 and JP-A-3-208514, amphoteric surfactants described in JP-A-59-121044 and JP-A-4-13149, siloxane-based compounds described in EP-950517, or copolymers of fluorine-containing monomer described in JP-A-62-170950, JP-A-11-288093 and Japanese Patent Application No. 2001-247351 may be added in order to improve coating property and to increase stability of processing according to development conditions.

Specific examples of the nonionic surfactant include sorbitan tristearate, sorbitan monopalmitate, sorbitan trioleate, stearic acid monoglyceride and polyoxyethylene nonyl phenyl ether. Specific examples of the amphoteric surfactant include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type surfactant (for example, "Amorgen K" (trade name) produced by Dai-Ichi Kogyo Seiyaku Co., Ltd.).

The siloxane-based compound is preferably a block copolymer of dimethylsiloxane and polyalkylene oxide, and specific examples thereof include a polyalkylene oxide-modified silicone, for example, DBE-224, DBE-621, DBE-712, DBP-732 or DBP-534 produced by Chisso Corp. and Tego Glide 100 produced by Tego in Germany.

A content of the nonionic or amphoteric surfactant is preferably from 0.01 to 15% by weight, more preferably from 0.1 to 5% by weight, still more preferably from 0.05 to 0.5% by weight, based on the total solid content of the image recording layer.

Printing Out Agent/Coloring Agent

To the image recording layer, a printing out agent for obtaining a visible image immediately after heating upon exposure, or a dye or pigment as an image coloring agent can be added.

A representative example of the printing out agent is a combination of a compound (photo acid releaser) capable of releasing an acid with heating upon exposure with an organic dye capable of forming a salt. Specific examples thereof include a combination of a o-naphthoquinonediazide-4-sulfonic acid halogenide with a salt-forming organic dye described in JP-A-50-36209 and JP-A-53-8128, and a combination of a trihalomethyl compound with a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole-based compound and a triazine-based compound, which are both excellent in preservation stability and provide a clear print-out image.

As for the image coloring agent, dyes other than the above-described salt-forming organic dyes may also be used. Preferable dyes include oil-soluble dyes and basic dyes, including the salt-forming organic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Kagaku Kogyo Co., Ltd.), Victoria Pure Blue, Crystal Violet Lactone, Crystal Violet (CI 42555), Methyl Violet (CI 42535), Ethyl Violet, Rhodamine B (CI 45170B), Malachite Green (CI 42000) and Methylene Blue (CI 52015). Dyes described in JP-A-62-293247 are particularly preferred.

Such a dye can be added in an amount of 0.01 to 10% by weight, preferably from 0.1 to 3% by weight, based on the total solid content of the image recording layer.

Plasticizer

To the image recording layer, a plasticizer is further added, if desired, in order to impart flexibility or the like to the coated film. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and an oligomer or polymer of acrylic acid or methacrylic acid.

Wax Agent

To the image recording layer of the lithographic printing plate precursor, a compound capable of decreasing a coefficient of static friction on the surface thereof may be added for the purpose of imparting resistance against scratch. Specific examples of the compound include compounds having an ester of long-chain alkylcarboxylic acid described in U.S. Pat. No. 6,117,913 and Japanese Patent Application Nos. 2001-261627, 2002-32904 and 2002-165584. An amount of the compound added is preferably from 0.1 to 10% by weight, more preferably from 0.5 to 5% by weight, based on the total solid content constituting the layer.

The lithographic printing plate precursor can be ordinarily produced by dissolving a heat-sensitive composition containing the above-described components in a solvent and coating the resulting solution on an appropriate support.

Coating Solvent

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, N-methylpyrrolidone, tetramethylurea, N-methylpyrrolidone, dimethyl sulfoxide, sulfolane, γ-butyrolactone, toluene and water, but the present invention should not be construed as being limited thereto. The solvents are used individually or as a mixture.

With respect to selection of the coating solvent, in the case where the lithographic printing plate precursor has a two-layer structure of an upper recording layer and a lower recording layer, the coating solvent for the upper recording layer is preferably selected from those of substantially not dissolving the lower recording layer, in order to prevent compatibility at the interface of these layers adjacently provided.

The concentration of the above-described components (total solid content including additives) in the solvent is preferably from 1 to 50% by weight. In the case of using an acid anhydride, a content of water in the coating solution is preferably controlled to 0.5% or less.

Coated Amount

A coated amount (solid content) of the heat-sensitive composition varies depending on use but in view of film properties and press life, the composition can be provided in a coated amount of 0.3 to 3.0 $g/m^2$, preferably from 0.5 to 2.5 $g/m^2$, more preferably from 0.8 to 1.6 $g/m^2$.

Multilayer Structure

In the lithographic printing plate precursor for use in the present invention, an image recording layer containing the above-described components is provided on a support. The image recording layer may have a multilayer structure of two or more layers. For the sake of convenience, the case having a two-layer structure consisting of an upper side layer and a lower side layer is described below.

In the case, an alkali-soluble resin constituting the upper side layer and the lower side layer may be the alkali-soluble resin described above, but the alkali-soluble resin used for the upper side layer preferably has a lower solubility in alkali than that of the lower side layer.

The infrared absorbing dye used may be different in the respective layers, or a plurality of infrared absorbing dyes may be used in the respective layers. As described above, the dye can be added in an amount of 0.01 to 50% by weight, preferably from 0.1 to 50% by weight, more preferably from 0.1 to 30% by weight, based on the total solid content of the layer to which the dye is added. In the case of adding the dye to a plurality of layers, it is preferred that the total amount of the dye added falls within the range described above.

Since the above-described thermally decomposable substance, which substantially decreases the solubility of the alkali-soluble resin before the thermal decomposition, may partially decompose with the lapse of time, in the case of the image recording layer having a multilayer structure, it may be effective to incorporate the substance into the lower side layer, but the substance can be added in either layer or in both layers. The amount of the substance added is as described above. In the case of adding the substance to a plurality of layers, it is preferred that the total amount of the substance added falls within the range described above.

The lactone compound may be added in either layer or in both layers, though in the case of a multilayer structure, it is effective to incorporate the lactone compound into the upper side layer.

Support

A hydrophilic support for use in the lithographic printing plate precursor includes a dimensionally stable plate-like material with necessary strength and durability. Examples thereof include paper, paper laminated with plastic (e.g., polyethylene, polypropylene or polystyrene), a metal plate (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated or vapor-deposited with the above-described metal.

Among the supports, a polyester film and an aluminum plate are preferred, and the aluminum plate is more preferred because it is dimensionally stable and relatively inexpensive. The aluminum plate is preferably a pure aluminum plate or an alloy plate containing mainly aluminum and a trace amount of hetero element. A plastic film laminated or vapor-deposited with aluminum may also be used. Examples of the hetero element contained in the aluminum alloy include silicon, iron, manganese, copper, magnesium, chromium, zinc, bismuth, nickel and titanium. The content thereof in the alloy is at most 10% by weight or less.

The particularly preferred aluminum plate is a pure aluminum plate, but a completely pure aluminum plate is difficult to produce in view of refining technique and therefore, an aluminum plate containing trace hetero elements may be used. Such an aluminum plate is not particularly limited in its composition, and a conventionally known and used material can be appropriately used. A thickness of the aluminum plate for use in the present invention is approximately from 0.1 to 0.6 mm, preferably from 0.15 to 0.4 mm, more preferably from 0.2 to 0.3 mm.

In advance of surface-roughening the aluminum plate, a degreasing treatment for removing a rolling oil on the surface thereof is performed, if desired, using a surfactant, an organic solvent, an alkaline aqueous solution or the like. A surface-roughening treatment of the aluminum plate surface is performed by various methods, for example, a mechanical surface-roughening method, a surface-roughening method of electrochemically dissolving the surface or a surface-roughening method of chemically dissolving the surface selectively. As for the mechanical method, a known method, for example, ball graining, brush graining, blast graining and buff graining may be used. As for the electrochemical surface-roughening method, a method of passing an alternating or direct current in an electrolytic solution of hydrochloric acid or nitric acid may be used. Also, a method using these two methods in combination described in JP-A-54-63902 may be employed.

The surface-roughened aluminum plate is subjected to an alkali etching treatment and a neutralization treatment, if desired, and then subjected to an anodizing treatment, if desired, in order to enhance water retentivity and abrasion resistance of the surface. As for an electrolyte used in the anodizing treatment of aluminum plate, various electrolytes capable of forming a porous oxide film may be used. Ordinarily, sulfuric acid, phosphoric acid, oxalic acid, chromic acid or a mixed acid thereof is used. A concentration of the electrolyte is appropriately determined according to the kind of electrolyte.

Since the anodizing treatment conditions vary depending on the electrolyte used, they cannot be indiscriminately specified. Ordinarily, however, the conditions are suitably such that the concentration of electrolyte is from 1 to 80% by weight, the liquid temperature is from 5 to 70° C., the current density is from 5 to 60 A/dm$^2$, the voltage is from 1 to 100 V, and the electrolysis time is from 10 seconds to 5 minutes. The amount of the anodic oxide film formed is preferably 1.0 g/m$^2$ or more in view of press life. After the anodizing treatment, the aluminum surface is subjected to a hydrophilization treatment, if desired. The hydrophilization treatment includes an alkali metal silicate (for example, aqueous sodium silicate solution) method described in U.S. Pat. Nos. 2,714,066, 3,181,461, 3,280,734 and 3,902,734. According to the method, the support is dipped or electrolyzed in an aqueous sodium silicate solution. Other examples include a method of treating the support with potassium fluorozirconate described in JP-B-36-22063 or with polyvinylphosphonic acid described in U.S. Pat. Nos. 3,276,868, 4,153,461 and 4,689,272.

The lithographic printing plate precursor for use in the present invention comprises at least the above-described image recording layer provided on a support, but if desired, an undercoat layer may be provided between the support and the image recording layer.

As for a component of the undercoat layer, various organic compounds are used, which are selected from, for instance, carboxymethyl cellulose; dextrin; gum arabic; an amino group-containing phosphonic acid, for example, 2-aminoethylphosphonic acid; an organic phosphonic acid, which may have a substituent, for example, phenylphosphonic acid, naphthylphosphonic acid, alkylphosphonic acid, glycerophosphonic acid, methylenediphosphonic acid or ethylenediphosphonic acid; an organic phosphoric acid, which may have a substituent, for example, phenylphosphoric acid, naphthylphosphoric acid, alkylphosphoric acid or glycerophosphoric acid; an organic phosphinic acid, which may have a substituent, for example, phenylphosphinic acid, naphthylphosphinic acid, alkylphosphinic acid or glycerophosphinic acid; an amino acid, for example, glycine and β-alanine; and a hydrochlorides of hydroxy group-containing amine, for example, hydrochloride of triethanolamine. The organic compounds may be used as a mixture of two or more thereof.

Also, an undercoat layer containing at least one compound selected from organic polymer compounds having a structural unit represented by the following formula is preferred.

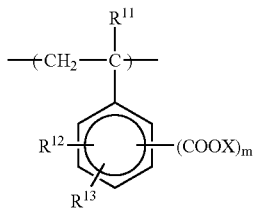

wherein $R^{11}$ represents a hydrogen atom, a halogen atom or an alkyl group, $R^{12}$ and $R^{13}$ each independently represents a hydrogen atom, a hydroxy group, a halogen atom, an alkyl group, a substituted alkyl group, an aryl group, a substituted aryl group, —$OR^{14}$, —$COOR^{15}$, —$CONHR^{16}$, —$COR^{17}$ or —CN, or $R^{12}$ and $R^{13}$ may be combined with each other to form a ring, $R^{14}$ to $R^{17}$ each independently represents an alkyl group or an aryl group, X represents a hydrogen atom, a metal atom or $NR^{18}R^{19}R^{20}R^{21}$, $R^{18}$ to $R^{21}$ each independently represents a hydrogen atom, an alkyl group, a substituted alkyl group, an aryl group or a substituted aryl group, or $R^{18}$ and $R^{19}$ may be combined with each other to form a ring, and m represents an integer of 1 to 3.

The undercoat layer can be provided by the following method. Specifically, the undercoat layer can be provided by a method where the organic compound is dissolved in water, an organic solvent, for example, methanol, ethanol or methyl ethyl ketone, or a mixed solvent thereof and the resulting solution is coated on an aluminum plate and then dried, or a method where an aluminum plate is dipped in a solution resulting from dissolving the organic compound in water, an organic solvent, for example, methanol, ethanol or methyl ethyl ketone, or a mixed solvent thereof to adsorb the compound, then washed with water or the like and dried. In the former method, a solution containing the organic compound at a concentration of 0.005 to 10% by weight can be coated by various methods. In the latter method, the concentration of the solution is from 0.01 to 20% by weight, preferably from 0.05 to 5% by weight, the dipping temperature is from 20 to 90° C., preferably from 25 to 50° C., and the dipping time is from 0.1 second to 20 minutes, preferably from 2 seconds to 1 minute. The solution used therefor may be adjusted to a pH of 1 to 12 using a basic substance, for example, ammonia, triethylamine or potassium hydroxide, or an acidic substance, for example, hydrochloric acid or phosphoric acid.

A coverage of the undercoat layer is suitably from 2 to 200 mg/m$^2$, preferably from 5 to 100 mg/m$^2$ in view of press life.

The lithographic printing plate precursor thus-prepared is imagewise exposed and then subjected to development processing using an alkali developing solution which is described in detail above.

Examples of a light source for actinic ray used for the imagewise exposure include a mercury lamp, a metal halide lamp, a xenon lamp, a chemical lamp and a carbon arc lamp. Examples of radiation for the imagewise exposure include electron beam, X-ray, ion beam and far infrared ray. Also, g-line, i-line, Deep-UV light and high-density energy beam (laser beam) may be used. Examples of the laser beam include helium-neon laser, argon laser, krypton laser, helium-cadmium laser and KrF excimer laser. In the present invention, a light source having a light emission wavelength in the region from near infrared to infrared is preferred, and a solid laser and a semiconductor laser are more preferred.

In the case where an unnecessary image portion is present on the lithographic printing plate obtained through the imagewise exposure, development, and water washing and/or rinsing and/or gumming, the unnecessary image portion is erased. The erasure is preferably performed by a method described in JP-B-2-13293, where an erasing solution is coated on the unnecessary image portion, the plate is allowed to stand as it is for a predetermined time and then washed with water, but may also be performed by a method described in JP-A-59-174842, where the unnecessary image portion is irradiated with active ray guided by an optical fiber and then developed.

The lithographic printing plate obtained according to the plate-making method of the present invention is coated with a desensitizing gum, if desired, and then can be used for printing, but in the case of imparting more improved press life to the lithographic printing plate, a burning treatment is applied thereto. In performing the burning treatment, the lithographic printing plate before the burning is preferably treated with a surface-conditioning solution described in JP-B-61-2518, JP-B-55-28062, JP-A-1-31859 and JP-A-61-159655.

With respect to the method therefor, the surface-conditioning solution is coated on the lithographic printing plate using a sponge or absorbent cotton impregnated with the solution or by dipping the printing plate in a vat filled with a surface-conditioning solution, or the surface-conditioning solution is coated by an automatic coater. To uniform the coated amount using a squeegee after coating or a squeegee roller provides more advantageous results.

A coated amount of the surface-conditioning solution is ordinarily from 0.03 to 0.8 g/m$^2$ (dry weight). The lithographic printing plate coated with the surface-conditioning solution is dried, if desired, and then heated at a high temperature using a burning processor (for example, Burning Processor BP-1300 available from Fuji Photo Film Co., Ltd.). In such a case, though the heating temperature and heating time vary depending on the kind of components constituting the image, they are preferably from 180 to 300° C. and from 1 to 20 minutes, respectively.

The lithographic printing plate after the burning treatment may be appropriately subjected to, if desired, conventional treatments, for example, water washing or gumming. However, when the surface-conditioning solution used contains a water-soluble polymer compound or the like, a so-called desensitizing treatment, for example, gumming can be omitted. The lithographic printing plate obtained through such treatments is mounted on an offset printing press and then used for printing a large number of sheets.

The present invention is described below according to the following embodiments illustrated with reference to the drawings.

FIG. 1 is a constitutional view showing a first embodiment of an automatic developing machine used for practicing the development replenishment method according to the present invention. As shown in FIG. 1, the automatic developing machine 2 comprises a developing unit 6 for developing a photosensitive lithographic printing plate precursor (hereinafter referred to as a "PS plate") 4, an after-processing unit 8 for washing off the developer adhered to the developed PS plate 4 and also for coating a gum solution thereon, and a drying unit 10 for drying the PS plate coated with the gum solution.

In the case of processing a PS plate, which requires heating prior to the development processing, a preheating unit (not shown in FIG. 1) may be provided. The preheating unit is disposed on the upstream side of the developing unit 6 in the transport direction and has a function of keeping a predetermined PS plate surface temperature for a predetermined period of time as the PS plate is transported. The PS plate inserted into the preheating unit is automatically transported to the next step while being heated. The developing apparatus may also comprise a pre-washing unit (not shown in FIG. 1). The pre-washing unit is disposed on the upstream side of the developing unit 6 in the transport direction and on the downstream side of the preheating unit in the transport direction and has a function of washing and cooling the PS plate surface with washing water as the PS plate is transported. The PS plate inserted into the pre-washing unit is automatically transported to the next step, that is, the developing unit 6.

An insert port 14 is formed in a side board 12 of the automatic developing machine 2, and the PS plate 4 inserted from the insert port 14 is transported to the developing unit 6 by transport rollers 16. At the insert port 14, a rubber blade 18 is provided and when the PS plate 4 is not inserted, the insert port 14 is closed by the rubber blade 18.

In a developing tank 20 of the developing unit 6, transport rollers 22, brush rollers 24 and squeeze rollers 26 are sequentially provided from the upstream side in the transport direction, and backup rollers 28 are also provided at appropriate positions between those rollers. As the plate is transported by the transport rollers 22, the PS plate 4 is dipped in the developer to conduct development processing.

The after-processing unit 8 connecting to the developing unit 6 comprises a washing unit 8a and a finisher unit 8b. In the washing unit 8a, rollers 30a' and 30a for transporting the PS plate 4, a washing tank 32a and nozzle members 34a for spraying washing water in the washing tank 32a to the PS plate 4 are provided. Also, a washing water supply pump 78a for supplying the washing water to the washing tank 32a is provided. In the finisher unit 8b, rollers 30b for transporting the PS plate 4, a finisher tank 32b, and nozzle members 34b for spraying the finisher solution in the finisher tank 32b to the PS plate 4 are provided. Also, a gum solution supply pump 77 for supplying the gum solution to the finisher tank 32b, and a gum solution diluent supply pump 78b for supplying a gum solution diluent are provided. The developed PS plate 4 is washed with a washing water sprayed from the ejection member 34a as it is transported by the transport rollers 30a, and thereafter coated with a finisher solution sprayed from the ejection member 34b as the PS plate 4 is transported by transport rollers 30b.

At this time, the diluent 57 in the replenisher diluent tank 57 is replenished to the washing tank 32a by the washing water supply pump 78a. In the finisher tank 32b, the gum solution in the gum solution tank 56 is replenished by the pump 77 and at the same time, the diluent 57 in the replenisher diluent storage tank 53 is replenished by the replenisher diluent supply pump 78b. The replenishment ratio between the gum solution and the diluent is, for example, 1:1. Along with such replenishment, a washing solution overflowed from the washing tank 32a and a gum waste solution overflowed from the finisher tank 32b are recovered in a waste solution tank 54 similarly to a development waste solution.

It is also effective to provide a washing brush roller (not shown in FIG. 1) in the washing unit 8a. The washing brush roller is disposed between the nozzle member 34a and the PS plate 4 to abut on the top surface or top and bottom surfaces of the PS plate 4, and while rotating, rubs to wash the surface of PS plate 4 under transportation.

On the other hand, a structure where the washing part 8a works as a first finisher unit 8a and the finisher unit 8b works as the second finisher unit 8b is also effective. In the first finisher unit 8a and second finisher unit 8b, transport rollers 30a and 30b for transporting the PS plate 4 and nozzle members 34a and 34b for spraying the gum solution in finisher tanks 32a and 32b to the PS plate 4 are provided. The PS plate 4 after the development is coated with the gum solution sprayed by the nozzle members 34a and 34b as it is transported by the transport rollers 30a and 30b. At this time, the gum solution in the finisher tank 32b of the second finisher unit 8b located on the downstream side is overflowed to be supplied to the finisher tank 32a of the first finisher unit 8a located on the upstream side, but in stead of such a constitution, the gum solution may be similarly supplied using a pump or the like. In this case, the washing water supply pump 78a is not used.

In the second finisher tank 32b, the gum solution in the gum solution tank 56 is replenished by the pump 77 and at the same time, the diluent 57 in the replenisher diluent storage tank 53 is replenished by the replenisher diluent supply pump 78. The replenishment ratio between the gum solution and the diluent is, for example, 1:1. Along with such replenishment, a gum waste solution overflowed from the first finisher tank 32a is recovered in the waste solution tank 54 similarly to the development waste solution.

In the drying unit 10 connecting to the finisher unit 8, a guide roller 36 and a pair of skewer rollers 38 are sequentially provided from the upstream side in the transport direction. Also, in the drying unit 10, a drying means (not shown), for example, a warm-air supply means or a heat-generating means is provided. A discharge port 40 is provided in the drying unit 10 and the PS plate 4 dried by the drying means is discharged from the discharge port 40. Furthermore, a shutter 44 is provided in a passage between the drying unit 10 and the finisher unit 8 and when the PS plate 4 is not passing through the passage 46, the passage 46 is closed by the shutter 44.

In a developing tank 20, a box-shaped shielding cover 60 is provided integrally with a tank wall. A bottom wall of the shielding cover 60 is structured to have curved depressions so as not to contact with upper circumferential surfaces of the transport roller 22, brush roller 24 and backup roller 28, thereby preventing from interference with rollers or the like. By virtue of the box shape of the shielding cover 60, an airtight space is formed above the developing tank 20 to provide an effect of minimizing an amount of air in the developing unit 6. Moreover, owing to the presence of the shielding cover 60, an area of the developer contacting with air is made as small as possible.

In the automatic developing apparatus 2 having the above-described construction, rubber blades 62 are provided at appropriate positions to construct a substantially airtight space from the developing unit 6 to the finisher unit 8b, whereby external air is prevented from flowing into the developing unit 6. The space between the developing unit 6 and the washing unit 8a is also made substantially airtight by a rubber blade 62 and the air in the washing unit 8a is prevented from flowing into the developing unit 6. Accordingly, the developing unit 6 is substantially airtight and established to have a closed construction allowing for almost no inflow of air, although air slightly flows into the developing unit 6 at the passage of PS plate 4.

The developing unit 6 is described in detail below. The developing tank 20 is connected to a circulation pipe 80 for the developer. In the circulation pipe 80, a developer circulation pump 71, an electric conductivity sensor 73 and a filter (not shown) are provided. The developer in the developing tank 20 is sucked into the circulation pipe 80 by the developer circulation pump 71 through the suction hole provided in the bottom of the developing tank 20, circulated in the circulation pipe 80 and discharged again into the developing tank 20. The filter filters the developer flowing in the circulation pipe 80. The electric conductivity sensor 73 measures the electric conductivity of the developer flowing in the circulation pipe 80.

Also, in the developing unit 6, members constituting a replenishment device, specifically, replenisher pipes 90 and 91, a replenisher stock solution storage tank 55 connected to the replenisher pipe 90, a replenisher stock solution supply pump 74 intervened in the replenisher pipe 90, a replenisher diluent storage tank 53 connected to the replenisher pipe 91, and a replenisher diluent supply pump 76 intervened in the replenisher pipe 91, are provided and these function as replenisher supply means. The development waste solution overflowed from the developing tank 20 is recovered in the waste solution tank 54.

More specifically, a pair of replenisher pipes 90 and 91 for the development replenisher obtained by diluting the development replenisher stock solution 58 with the replenisher diluent 57 is provided in the vicinity of the developing tank 20. The replenisher pipe 90 for the development replenisher stock solution 58 is connected to the replenisher stock solution storage tank 55 at another end (bottom in FIG. 1), and in the pipe, the replenisher stock solution supply pump 74 is provided. The replenisher stock solution supply pump 74 supplies the development replenisher stock solution 58 to the developing tank 20 from the replenisher stock solution storage tank 55. The replenisher pipe 91 for the replenisher diluent 57 is connected to the replenisher diluent storage tank 53 at another end (bottom in FIG. 1), and in the pipe, the replenisher diluent supply pump 76 is provided. The replenisher diluent supply pump 76 supplies the replenisher diluent (water) 57 to the developing tank 20 from the replenisher dilent storage tank 53. In other words, a diluent replenishment device is constituted by the replenisher pipe 91, the replenisher diluent supply pump 76 and the replenisher diluent storage tank 53.

The replenisher stock solution supply pump 74 and the replenisher diluent supply pump 76 are controlled by a control device (controlling means) 50 comprising a controlling ROM 51a or controlling RAM 51b as a condition memorizing device and a time measuring unit 52, based on signals from the electric conductivity sensor 73 and the time measuring unit 52. Also, the control device 50 processes the transportation of PS plates by driving the transport rollers 22, brush rollers 24, squeeze rollers 26 and the like at appropriate timing based on signals from the plate detection sensor 27.

Furthermore, in the control device 50, the elapsed time from the last integration of time lapse replenishment and the elapsed time from the last measurement of electric conductivity are measured by the time measuring unit 52, and the electric conductivity of developer is measured by the electric conductivity sensor 73. By using these measured values and, if desired, at a previously determined replenishment amount-replenisher dilution ratio, the control device 50 supplies the development replenisher (development replenisher stock solution 58+replenisher diluent 57) to the developing tank 20 from the replenisher stock solution storage tank 55 and the replenisher diluent storage tank 53.

The control by the control device 50 is described in detail below. FIGS. 2, 3, 4 and 5 each is an example of the flow chart showing the control system by the control device 50. According to the control systems, contents of the control are changed between a case where a high resolution image is treated and a case where an image other than the high resolution image is treated and in the respective cases, replenishment can be performed in an appropriate replenishment amount even when the processing condition, for example, plate species, plate size or processing frequency is varied.

Figure 2:
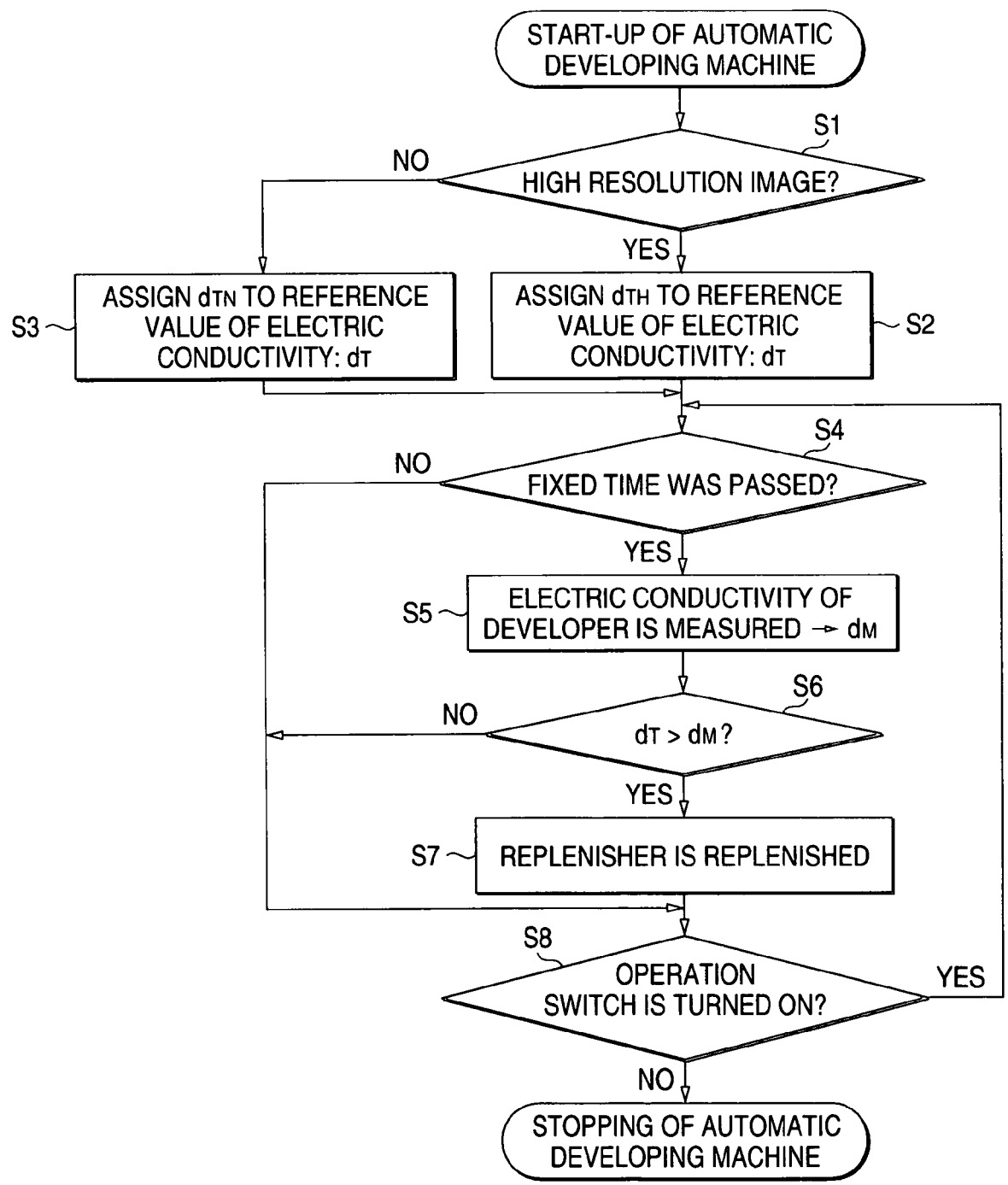
FIG. 2 shows a flow chart for explaining a fundamental control processing of replenishing a development replenisher.

A fundamental control processing of replenishing the development replenisher is described below with reference to FIG. 2.

At step 1 (hereinafter simply referred to as "S1"), whether an exposed printing plate precursor introduced into the developing machine has a high resolution image is judged. The high resolution image means an image in which an output datum of 50% area ratio is 210 lpi or more in terms of a peripheral length of an image area in an image unit that constitutes a gradation of a screen image. In the case of development processing the high resolution image, the electric conductivity value of developer for providing an adequate developer activity is set differently from a case of development processing an ordinary image (not high resolution image), thereby achieving an adequate developer sensitivity.

Specifically, in the case of high resolution image, an electric conductivity value: $d_{TH}$ of developer for providing an adequate developer activity experimentally determined in advance with respect to the high resolution image is set as an electric conductivity reference value: $d_T$ (S2). On the other hand, in the case of not high resolution image, an electric conductivity value: $d_{TN}$ of developer for providing an adequate developer activity experimentally determined in advance with respect to an ordinary image is set as an electric conductivity reference value: $d_T$ (S3).

Then, at S4, whether the elapsed time from start-up or last measurement of the electric conductivity of developer reaches a previously determined time is judged, and the operation advances to S5 when reached or advances to S8 when not reached.

At S5, the electric conductivity of developer is measured. At S6, the measured electric conductivity value: $d_M$ of developer is compared with the electric conductivity reference value: $d_T$ and the operation advances to S7 when the electric conductivity value: $d_M$ of developer is smaller than the electric conductivity reference value: $d_T$, otherwise advances to S8.

At S7, the replenisher in a previously determined amount is replenished to the developer, and the operation advances to S8.

At S8, the state of the operation switch for the automatic developing machine is checked, and the operation returns to S4 when the operation switch is turned on or the processing is terminated due to stopping of the machine when the operation switch is turned off.

Figure 3:
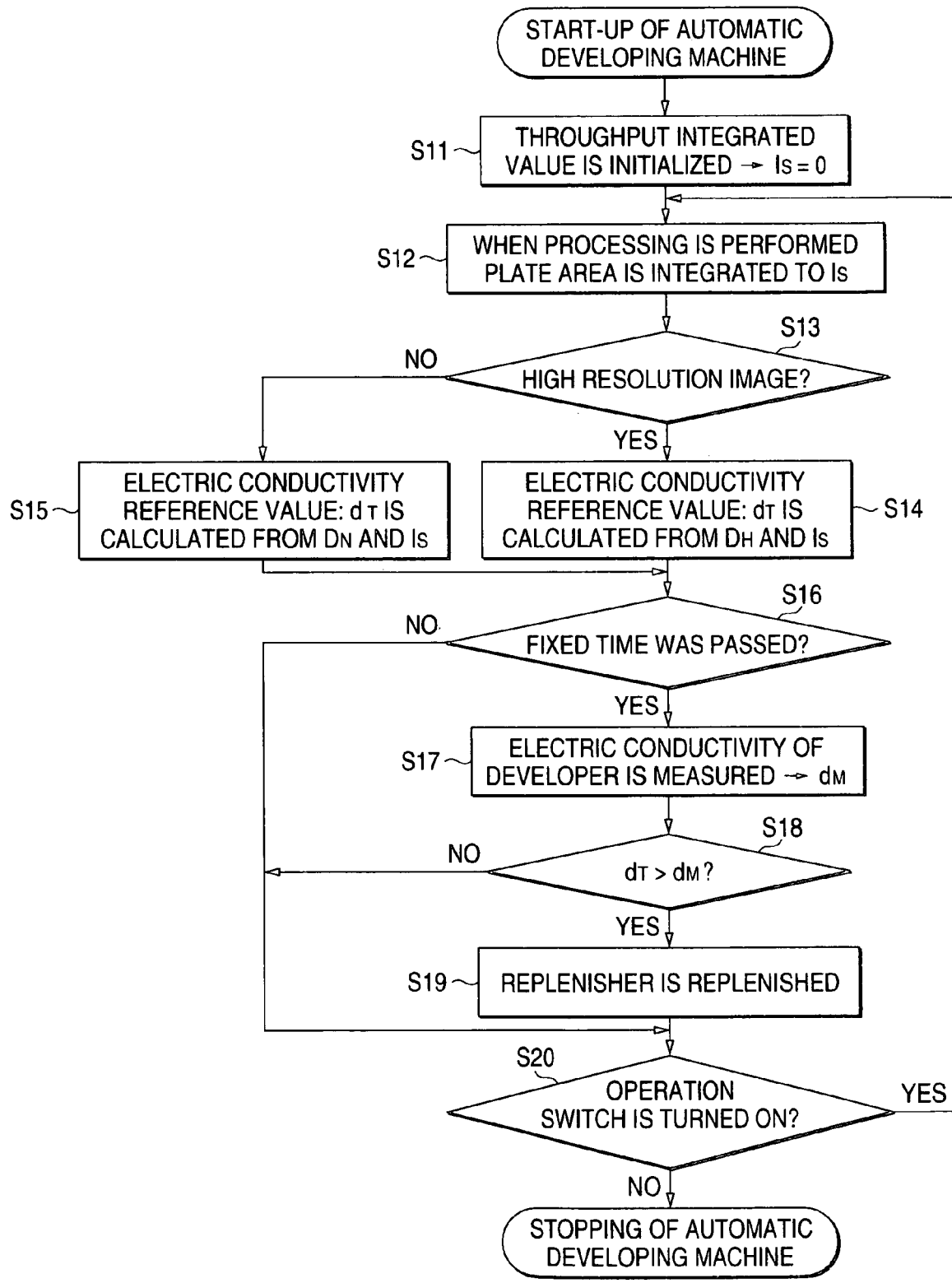
FIG. 3 shows a flow chart for explaining a first control processing.

The first control processing in which the above-described fundamental control processing is specifically shown is described below with reference to FIG. 3.

At S11, a processing amount integrated value: $I_S$, which is a variable used during the control, is initialized, that is, 0 is assigned. At S12, when the processing is performed, the processed area is integrated to $I_S$.

At S13, whether an exposed printing plate precursor to be processed has a high resolution image is judged. In the case of high resolution image, the electric conductivity reference value: $d_T$ is calculated from the electric conductivity value: $D_{TH}$ of developer for providing an adequate developer activity experimentally determined in advance with respect to the high resolution image and the processing amount integrated value: $I_S$ (S14). An arithmetic expression used here is preferably, for example, the following formula:

$$d_T=(D_{TH}-D_L)\times\text{EXP}(-C_1\times I_S)+D_L \qquad \text{Arithmetic Expression 1}$$

(wherein $D_{TH}$, $D_L$ and $C_1$ are constants experimentally determined in advance, and $\text{EXP}(x)=e^x$).

On the other hand, in the case of not high resolution image, the electric conductivity reference value: $d_T$ is calculated from the electric conductivity value: $D_{TN}$ of developer for providing an adequate developer activity experimentally determined in advance with respect to an ordinary image and the processing amount integrated value: $I_S$ (S15). An arithmetic expression used here is preferably, for example, the following formula:

$$d_T=(D_{TN}-D_L)\times\text{EXP}(-C_1\times I_S)+D_L \qquad \text{Arithmetic Expression 2}$$

(wherein $D_{TN}$, $D_L$ and $C_1$ are constants experimentally determined in advance, and $\text{EXP}(x)=e^x$).

At S16, whether the elapsed time from start-up or last measurement of the electric conductivity of developer reaches a previously determined time is judged, and the operation advances to S17 when reached or advances to S20 when not reached.

At S17, the electric conductivity of developer is measured and the measured value is assigned to a variable: $d_M$. Then, at S18, the $d_M$ is compared with the $d_T$, and the operation advances to S19 when the $d_M$ is smaller or advances to S20 when $d_M$ is larger. At S19, the replenisher in a previously determined amount is replenished to the developer.

At S20, the state of the operation switch for the automatic developing machine is checked, and the operation returns to S12 when the operation switch is turned on or the processing is terminated due to stopping of the machine when the operation switch is turned off.

Figure 4:
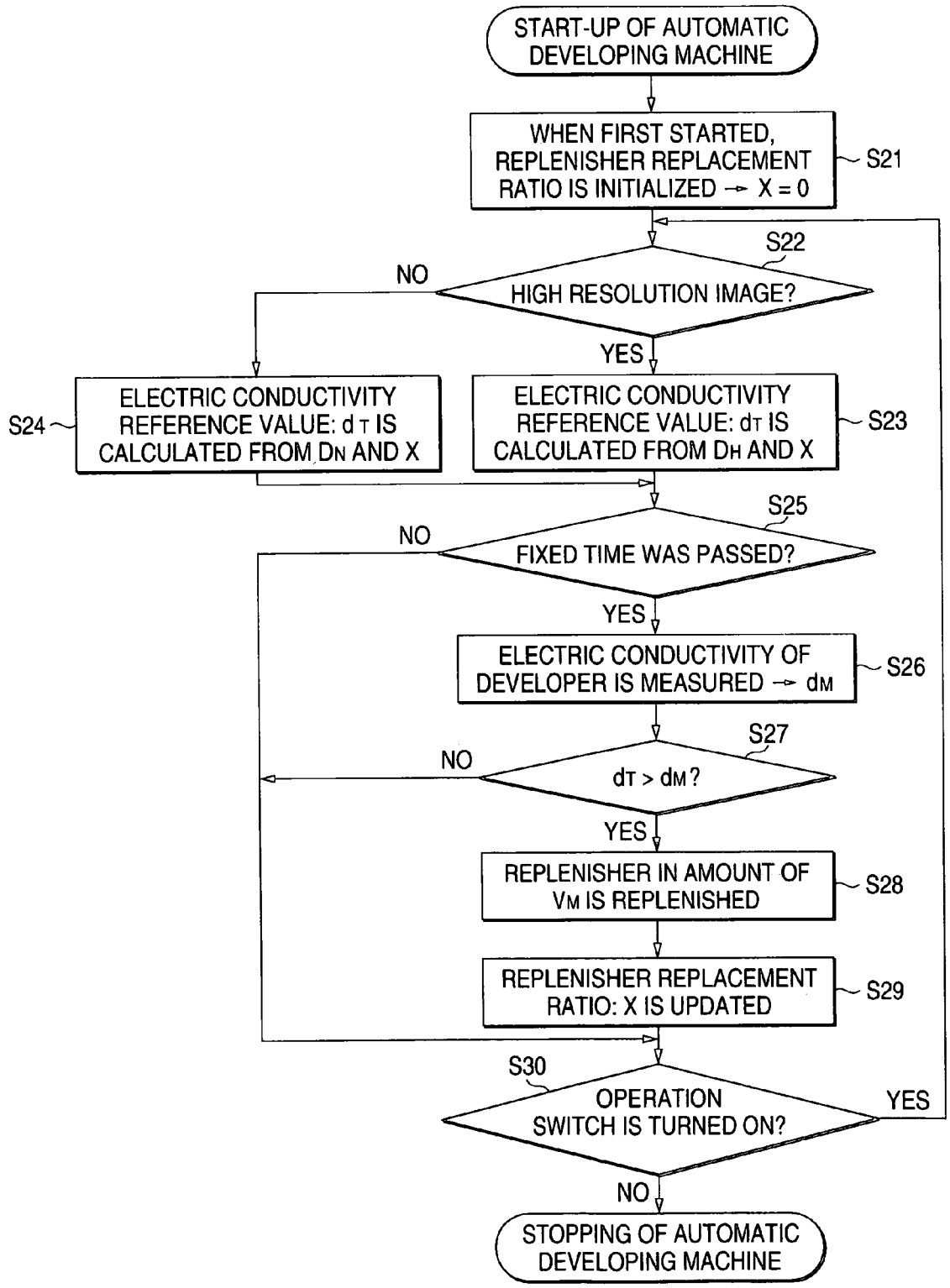
FIG. 4 shows a flow chart for explaining a second control processing.

The second control processing is described below with reference to FIG. 4.

At S21, whether the automatic developing machine is first started or not is judged and first started, a replenisher replacement ratio: X, which is a variable used during the control, is initialized, that is, 0 is assigned.

At S22, whether an exposed printing plate precursor to be processed has a high resolution image is judged. In the case of high resolution image, the electric conductivity reference value: $d_T$ is calculated from the electric conductivity value: $D_H$ of developer for providing an adequate developer activity experimentally determined in advance with respect to the high resolution image and the replenisher replacement ratio: X (S23). An arithmetic expression used here is preferably, for example, the following formula:

$$d_T=D_H+(1-X)\times D_M+X\times d_L \qquad \text{Arithmetic Expression 3}$$

(wherein $D_M$ and $d_L$ are constants experimentally determined in advance).

On the other hand, in the case of not high resolution image, the electric conductivity reference value: $d_T$ is calculated from the electric conductivity value: $D_N$ of developer for providing an adequate developer activity experimentally determined in advance with respect to an ordinary image and the replenisher replacement ratio: X (S23). An arithmetic expression used here is preferably, for example, the following formula:

$$d_T=D_N+(1-X)\times D_M+X\times d_L \qquad \text{Arithmetic Expression 4}$$

(wherein $D_M$ and $d_L$ are constants experimentally determined in advance).

At S25, whether the elapsed time from start-up or last measurement of the electric conductivity of developer reaches a previously determined time is judged, and the operation advances to S26 when reached or advances to S30 when not reached.

At S26, the electric conductivity of developer is measured and the measured value is assigned to a variable: $d_M$. Then, at S27, the $d_M$ is compared with the $d_T$, and the operation advances to S28 when the $d_M$ is smaller or advances to S30 when $d_M$ is larger. At S28, the replenisher in a previously determined amount: $V_H$ is replenished to the developer. At S29, the X is updated using the $V_H$ and an arithmetic expression. The arithmetic expression used here is preferably the following formula:

$$X=(V_T\times X_o+V_H)\div(V_T+V_H) \qquad \text{Arithmetic Expression 5}$$

(wherein $X_o$ is a replenisher replacement ratio value before update, and $V_T$ is a volume of developer in developing tank).

At S30, the state of the operation switch for the automatic developing machine is checked, and the operation returns to S22 when the operation switch is turned on or the processing is terminated due to stopping of the machine when the operation switch is turned off.

Figure 5:
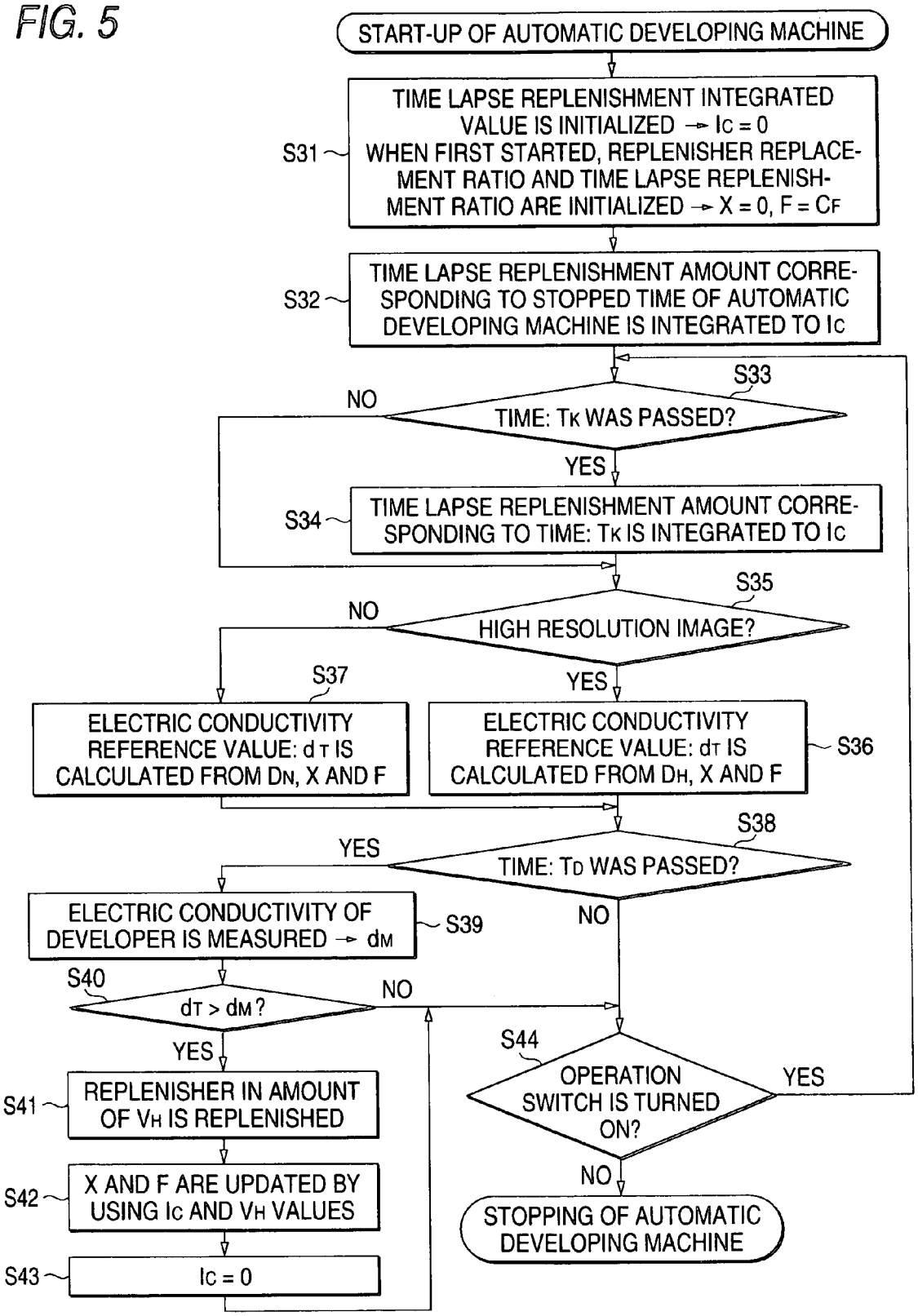
FIG. 5 shows a flow chart for explaining a third control processing.

The third control processing is described below with reference to FIG. 5.

At S31, a time lapse replenishment integrated value: $I_C$, which is a variable used during the control, is initialized, that is, 0 is assigned. Also, whether the automatic developing machine is first started or not is judged and when first started, a replenisher replacement ratio: X and a time lapse replenishment ratio: F, which are variables used during the control, are initialized, that is, 0 is assigned to X and a previously determined constant: $C_F$ is assigned to F.

At S32, a time lapse replenishment amount corresponding to a stopped time: $T_F$ of the automatic developing machine is integrated to $I_C$, for example, using the following arithmetic expression:

$$I_C+V_F\times T_F\rightarrow I_C \qquad \text{Arithmetic Expression 6}$$

(wherein $V_F$ is a constant experimentally determined in advance).

At S33, whether the elapsed time from start-up or last integration of the aging replenishment amount reaches a previously determined time: $T_K$ is judged, and the operation advances to S34 when reached or advances to S35 when not reached.

At S34, the time lapse replenishment amount necessary for the elapsed time: $T_K$ is integrated to $I_C$, for example, using the following arithmetic expression:

$$I_C+V_N\times T_K\rightarrow I_C \qquad \text{Arithmetic Expression 7}$$

(wherein $V_N$ is a constant experimentally determined in advance).

At S35, whether an exposed printing plate precursor to be processed has a high resolution image is judged. In the case of high resolution image, the electric conductivity reference value: $d_T$ is calculated from the electric conductivity value: $D_H$ of developer for providing an adequate developer activity experimentally determined in advance with respect to the high resolution image, the replenisher replacement ratio: X and the time lapse replenishment ratio: F (S36). An arithmetic expression used here is preferably, for example, the following formula:

$$d_T=D_H+(1-X)\times D_M+X\times((1-F)\times D_B+F\times D_C) \qquad \text{Arithmetic Expression 8}$$

(wherein $D_M$, $D_B$ and $D_C$ are constants experimentally determined in advance).

On the other hand, in the case of not high resolution image, the electric conductivity reference value: $d_T$ is calculated from the electric conductivity value: $D_N$ of developer for providing an adequate developer activity experimentally determined in advance with respect to an ordinary image, the replenisher replacement ratio: X and the time lapse replenishment ratio: F (S37). An arithmetic expression used here is preferably, for example, the following formula:

$$d_T = D_N + (1-X) \times D_M + X \times ((1-F) \times D_B + F \times D_C) \quad \text{Arithmetic Expression 9}$$

(wherein $D_M$, $D_B$ and $D_C$ are constants experimentally determined in advance).

At S38, whether the elapsed time from start-up or last measurement of the electric conductivity of developer reaches a previously determined time: $T_D$ is judged, and the operation advances to S39 when reached or advances to S44 when not reached.

At S39, the electric conductivity of developer is measured and the measured value is assigned to a variable: $d_M$. Then, at S40, the electric conductivity of developer: $d_M$ is compared with the electric conductivity reference value: $d_T$, and the operation advances to S41 when the $d_M$ is smaller, otherwise advances to S44.

At S41, the replenisher in a previously determined amount $V_H$ is replenished to the developer.

At S42, the values of X and F are updated by using the values of $I_C$ and $V_H$. The updating of these values is suitably performed, for example, according to the following arithmetic expressions.

$$(V_T \times X + V_H) \div (V_T + V_H) \to X \quad \text{Arithmetic Expression 10}$$

$$(V_T \times X \times F + I_C) \div (V_T \times X + V_H) \to F \quad \text{Arithmetic Expression 11}$$

(wherein $V_T$ is a volume of developer in developing tank).

At next S41, $I_C$ is initialized, that is, 0 is assigned.

At S44, the state of the operation switch for the automatic developing machine is checked, and the operation returns to S33 when the operation switch is turned on or the processing is terminated due to stopping of the machine when the operation switch is turned off.

According to the control of the automatic developing machine described above, since the electric conductivity reference value is changed in the case of processing the high resolution image and in the case of processing an image other than the high resolution image, in the respective cases an appropriate replenishment can be always carried out even when processing condition, for example, plate species, plate size or processing frequency is varied, so that the stable development processing with constant sensitivity can be performed. As a result, despite a simple and inexpensive construction of a developing unit of the automatic developing machine, the fluctuation of developer sensitivity due to change in the conditions of development processing can be minimized in any image of resolution including a high resolution image and a conventional image on printed material.

Figure 6:
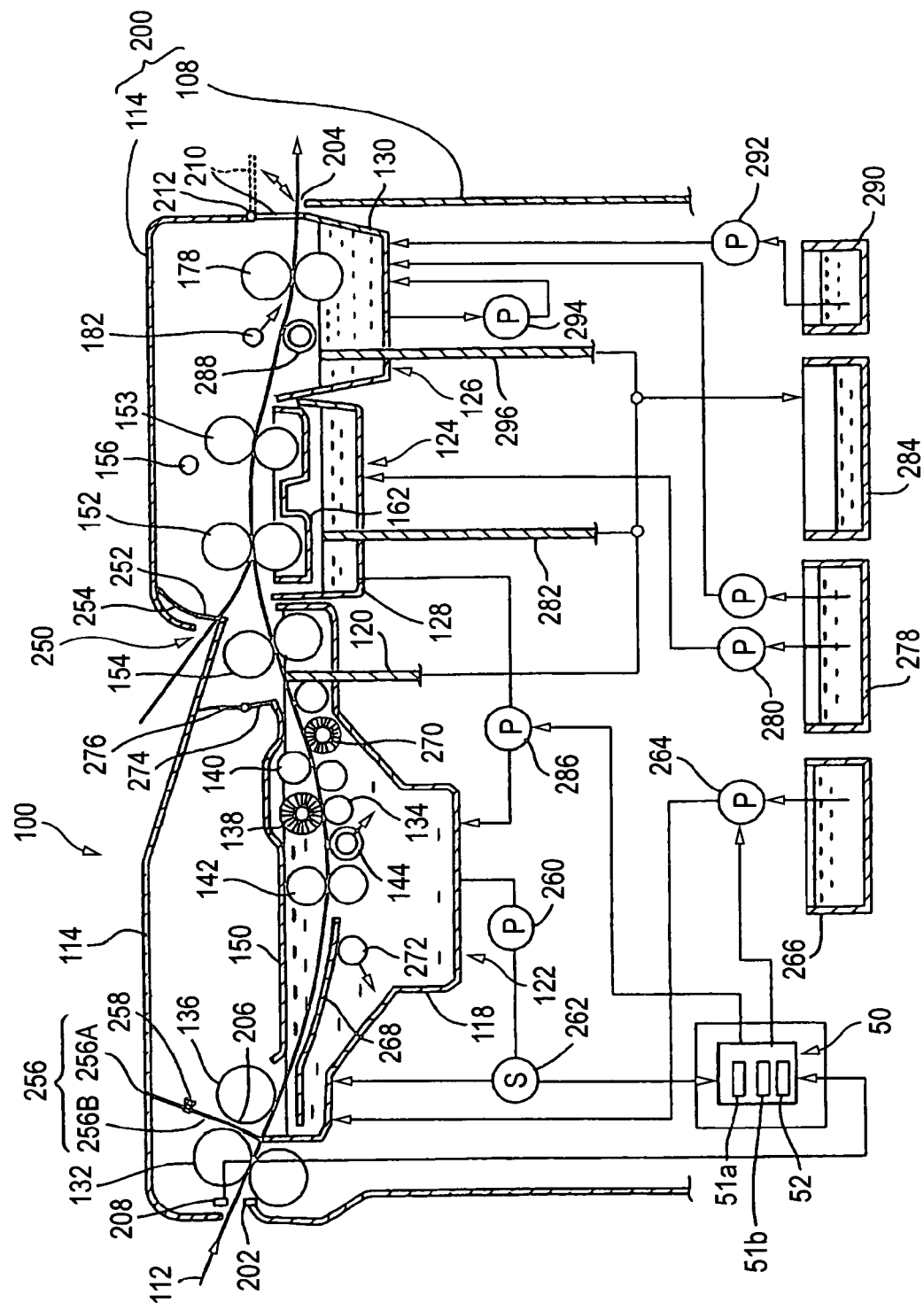
FIG. 6 shows a constitutional view of an automatic developing machine according to a second embodiment of the present invention.

A second embodiment of the present invention is described below. FIG. 6 is a constitutional view of an automatic developing machine according to the second embodiment of the present invention. As shown in FIG. 6, in the automatic developing machine 100 of the embodiment, processing units in the inside thereof are covered with an outer panel 114. Inside the outer panel 114, a developing unit 122 comprising a developing tank 118 for developing a PS plate 112 and an overflow pipe 120 for recovering a developer overflowed from the developing tank 118, a washing unit 124 for water-washing the developer adhered to the PS plate 112, and a finisher unit 126 for desensitizing the washed PS plate 112 by coating a gum solution are disposed. In the washing unit 124, a washing tank 128 is disposed and in the finisher unit 126, a gum solution tank 130 is disposed.

In the outer panel 114, a slit-shaped insert port 202 and a slit-shaped discharge port 204 are provided. In the top surface of the outer panel 114, a reentry insert port (sub-insert port) 250 for insertion of the PS plate 112 between the developing unit 122 and the washing unit 124 is provided. The sub-insert port 250 works as a port for inserting the PS plate 112 in order to perform processing except for the development.

At the sub-insert port 250, a blade 252 is disposed. A leading end of the blade 252 is brought into contact with the outer panel 114 acting as a guiding support surface for the sub-insert port 250, and the base thereof is fixed to the back surface side of the outer panel 114 through a bracket 254. Therefore, the sub-insert port 250 is in the state of being closed by the blade 252.

A drying unit (not shown) dries the PS plate 112 by blowing warm air onto both surfaces thereof as the PS plate 112 delivered from the finisher unit 126 is transported by multiple rollers (not shown).

A pair of transport rollers 132 are disposed on the side of inserting the PS plate 112 into the developing tank 118 of the developing unit 122, and the PS plate 112 is inserted between the pair of transport rollers 132 from the insert port 202.

A rubber-made blade 206 is fixed in the vicinity of the transport roller 132 on the downstream side. A leading end of the blade 206 is brought into contact with the side wall of the developing tank 118 in the developing unit 122, and the base thereof is attached to the outer panel 114 through a bracket 256. The bracket 256 comprises a fixed part 256A and a sliding part 256B attached to the fixed part 256A with a thumbscrew 258, and the blade 206 is fixed to the sliding part 256B. Therefore, in this construction, the leading end of the blade 206 can be separated from the side wall of the developing tank 118 by loosening the thumbscrew 258 and moving the sliding part 256B relative to the fixed part 256A.

Furthermore, in the vicinity of the insert port 202, a plate detection sensor 208 capable of determining the presence or absence of the PS plate 112 and measuring the plate area or the like of the plate transported is attached.

The developing tank 118 has a substantially inverted mountain shape with the top being opened and the bottom center part protruding downward. In the developing tank 118, a pump 260 is provided, and the developer in the developing tank 118 is sucked out by the pump 260 and ejected from spray pipes 144 and 272, which are described later, whereby the developer stored in the developing tank 118 is circulated. During the circulation, the developer passes through an electric conductivity sensor 262 for measuring the electric conductivity of developer. Also, in the developing tank 118, the replenisher stock solution is supplied from a development replenisher stock solution tank 266 through a replenisher stock solution supply pump 264. Furthermore, as described later, diluting water is supplied to the developing tank 118 from the washing tank 128 through a pump 286.

The pumps 264 and 286 are controlled by a control device 50 comprising a controlling ROM 51a or controlling RAM 51b as a condition memorizing means and a time measuring unit 52, based on signals from the electric conductivity sensor 262 and the time measuring unit 52. The operational effects of the control device 50 are same as those described in the first embodiment and they are omitted here.

In the developing tank 118, a guide plate 268 is disposed on the upstream side, and many guide rollers 134 and a rotary brush roller 270 are disposed on the downstream side. The guide rollers 134 and rotary brush roller 270 are rotatably bridged over a pair of side boards of the developing tank 118.

A guide roller 136 having a relatively large diameter is disposed above the guide plate 268, and rotary brush rollers 138 and 270 and a guide roller 140 are disposed above the guide roller 134. Also, in the center part of the developing tank 118, a pair of squeeze rollers 142 having a function of squeezing the surface of the PS plate 112 are disposed.

The overflow pipe 120 is disposed on the most downstream side of the developing tank 118 and when the liquid surface of the developer exceeds a predetermined level, the developer is guided by the pipe to a waste solution tank 284.

A liquid surface cover 150 is disposed on the surface of developer in the developing tank 118. The liquid surface cover 150 is protruding nearly like an arc at the portion corresponding to the rotary brush roller 138 and guide roller 140 adjacent thereto, and contacting with the liquid surface of developer so as to maximally prevent the developer from contacting with air. Also, the liquid surface cover 150 is slidably held at its both edges in the transport direction of the PS plate 112 by the side boards (not shown) in such a manner as to permit a vertical motion of the cover in accordance with increase or decrease of the developer.

The end of the liquid surface cover 150 on the downstream side in the transport direction is brought into contact with a leading end of a blade 274. The blade 274 is fixed to the outer panel 114 via a bracket 276. The liquid surface of the developer exposed at the downstream end of the liquid cover 150 in the transport direction is separated by the blade 274 from the space above the liquid surface cover 150, and thus the space above the liquid surface cover 150 is perfectly isolated from external air by the blade 206 (in the state of contacting with the side wall of the developing tank 118) in the vicinity of the insert port 202, whereby the developer can be prevented from evaporation.

On the most downstream side of the developing tank 118 in the transport direction, a pair of rollers 154 for holding and transporting the PS plate 112 and at the same time, squeezing the developer from the surface of the PS plate 112 are disposed.

On the other hand, in the automatic developing machine 100, the washing tank 128 of the washing unit 124 is disposed on the downstream side of the developing unit 122, and two pairs of transport rollers 152 and 153 are disposed above the washing tank 128.

The washing tank 128 stores washing water used for washing out the developer on the PS plate 112 delivered from the developing tank 118. A spray pipe 156 is disposed on the upstream side of the transport roller 153 and above the transport passage. In the outer circumference of the spray pipe 156, a plurality of ejection ports communicating with the inside are provided. The washing water pumped up by the pump 280 from the washing water tank 278 is dropped from the spray pipe 156 on the upper roller of the transport rollers 153 and with the rotation of the transport roller 153, the washing water rapidly spreads on the surface of the PS plate 112, whereby the surface of the PS plate 112 is cleaned with the washing water.

The lower roller of the transport roller 152 or 153 is housed at its bottom in a pan 162. The pan 162 stores washing water, and the washing water is scooped up by the lower roller and used to clean the back surface of the PS plate 112 and also prevent the drying of the upper transport roller 152 or 153.

The washing water spread laterally on the front surface of the PS plate 112 falls into the pan 162 from both ends in the crosswise direction of the PS plate 112, and the washing water scooped up from the pan 162 is used to treat the back surface of the PS plate 112. The washing water overflowed from the pan 162 is guided into the washing tank 128. In the washing tank 128, an overflow pipe 282 is disposed and when the waste water exceeds a predetermined liquid surface, the washing water is discarded into the waste solution tank 284.

The washing tank 128 and the developing tank 118 are communicating with each other via a pump 286 and when the pump 286 is driven, the washing water in the washing tank 128 is guided into the developing tank 118 and can be used as a diluent at the time of supplying the replenisher stock solution to the developing tank 118.

A pair of transport rollers 178 are provided above the gum solution tank 130 of the finisher unit 126. The PS plate 112 delivered by the transport rollers 153 is guided to the transport rollers 178.

On the upstream side of the transport rollers 178, spray pipes 182 and 288 are disposed above the transport passage and below the transport passage, respectively. The gum solution pumped up by a pump 292 from the gum solution tank 290 is ejected from the spray pipe 182 or 288 and supplied to the front or back surface of the PS plate 112.

The transport rollers 178 hold and transport the PS plate 112 and at the same time, squeeze the gum solution supplied by the spray pipe 182 for desensitizing the surface of the PS plate 112. The gum solution squeezed off from the surface of the PS plate 112 is recovered in the gum solution tank 130. The gum solution in the gum solution tank 130 is circulated by the pump 294. In the gum solution tank 130, an overflow pipe 296 is provided and when the gum solution exceeds a predetermined liquid surface, the gum solution is guided to and discarded in the waste solution tank 284.

The bottom of the lower transport roller 178 is immersed in the gum solution stored in the gum solution tank 130, and the gum solution is scooped up by the lower transport roller 178 from the gum solution tank 130 and coated on the back surface of the PS plate 112, whereby the back surface of the PS plate 112 is desensitized with the gum solution scooped up by the transport roller 178 and at the same time, the upper transport roller 178 is prevented from drying so as not to deposit components of the processing solution on the surface of the transport roller 178.

The PS plate 112 after the completion of treatments in the finisher unit 126 is delivered to the drying unit (not shown) through the discharge port 204 of a casing 200.

A lid body 210 serving as a shutter is provided at the discharge port 204. The lid body 210 is fixed to a shaft 212. The shaft 212 is made rotatable by a driving device (for example, a solenoid) (not shown). The shaft 212 rotates based on the detection of PS plate 112 by the plate detection sensor 208 provided in the vicinity of the insert port 202. More specifically, the lid body 210 is kept at a substantially horizontal position (opened state of discharge port 204) during the time of detecting the PS plate 112 by the plate detection sensor 208 and during the passage of a predetermined time after the plate is not detected (after the rear end is detected), or otherwise kept at a vertical position (closed state of discharge port 204).

The operation of the embodiment is described below. The processing tanks, for example, developing tank 118, washing tank 128 and gum solution tank 130 are covered with a casing 200, for example, top cover 114 and main body 108. In the case where the development of PS plate 112 is not being processed in the automatic developing machine 100, the blade 206 is brought into contact with the side wall of the developing tank 118 and therefore, the insert port 202 is closed. Also, the plate detection sensor 208 does not detect the PS plate 112 and therefore, the lid body 210 is in the vertical position to close the discharge port 204. Furthermore, the sub-insert port 250 is also closed by the blade 252, and the space above the liquid surface cover 150 of the developing unit 122 is also closed by the blades 206 and 122. Accordingly, the developer in the developing tank 118, the washing water in the washing unit 124 and the gum solution in the finisher unit 126 are protected from exposure to external air and substantially free of carbon dioxide fatigue. As a result, the developing capability can be prevented from reduction due to time lapse deterioration and therefore, the replenishment amount, for example, of the replenisher stock solution in the developing unit 122 can be drastically reduced. In particular, the developer surface of the developing tank 118 is covered with the liquid surface cover 150 and therefore, the effect of preventing the developer from contact with external air is large.

Further, the lid body 210 is preferably made open as short as possible so as to minimize the contact of developer with external air. Accordingly, in a preferred constitution, the lid body is opened only when the PS plate 112 is passing, and closed at other times.

The contents of control by the control device 50 is same as the contents in the flow chart showing the replenishment method of the development replenisher in FIGS. 2, 3, 4 and 5 described above for the first embodiment and therefore, the description thereof is omitted here.

EXAMPLE

A fluctuation range of developer sensitivity was experimentally determined in the case where the replenishment method for development replenisher according to the embodiment described above or a conventional replenishment method for development replenisher was performed. Methods for production of Developers A, B, C and D, Replenishers A, B, C and D, and Photosensitive Materials A, B, C, D and E used in Examples 1 to 7 and Comparative Examples 1 to 14 are described below.

Developer A

Developer A was prepared by diluting Developer DP-7 (produced by Fuji Photo Film Co., Ltd.) with water to be 1/9.

Developer B

Developer B was prepared by diluting Developer DT-2 (produced by Fuji Photo Film Co., Ltd.) with water to be 1/9.

Developer C

Developer C was prepared by dissolving the components shown below in water and adjusting pH to the value shown below with KOH.

| Surfactant shown below | 5% by weight |
| --- | --- |
| 2,4,7,9-Tetramethyl-5-decyn-4,7-diol | 0.1% by weight |

-continued

| Tetrasodium ethylenediaminetetraactate | 0.2% by weight |
| --- | --- |
| Potassium carbonate | 0.2% by weight |
| pH (25° C.) | 12.0 |

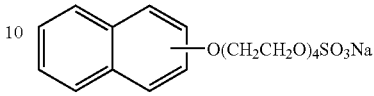

Developer D

Developer D was prepared by dissolving the components shown below in water and adjusting pH to the value shown below with KOH.

| Compound of formula (I): (Y) shown below | 50 g |
| --- | --- |
| Tetrasodium ethylenediaminetetraactate | 0.1 g |
| Additive 1: (P) shown below | 1.0 g |
| Additive 2: (Q) shown below | 1.0 g |
| pH (25° C.) | 12.0 |

(Y)

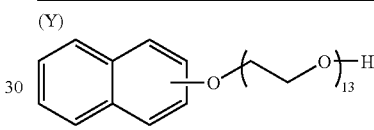

(P)

(Q)

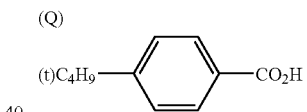

Replenisher A

Development Replenisher DP-7RW (produced by Fuji Photo Film Co., Ltd.) was used.

Replenisher B

Development Replenisher DT-2R (produced by Fuji Photo Film Co., Ltd.) was used.

Replenisher C

Replenisher C was prepared by dissolving the components shown below in water and adjusting pH to the value shown below with KOH.

| Surfactant shown below | 5% by weight |
| --- | --- |
| 2,4,7,9-Tetrarmethyl-5-decyn-4,7-diol | 0.1% by weight |
| Tetrasodium ethylenediaminetetraactate | 0.2% by weight |
| Potassium carbonate | 0.2% by weight |
| pH (25° C.) | 13.0 |

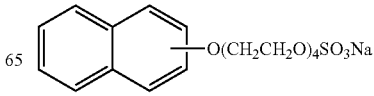

Replenisher D

Replenisher D was prepared by dissolving the components shown below in water and adjusting pH to the value shown below with KOH.

| | |
|---|---|
| Compound of formula (I): (Y) shown below | 50 g |
| Tetrasodium ethylenediaminetetraactate | 0.1 g |
| Additive 1: (P) shown below | 1.0 g |
| Additive 2: (Q) shown below | 1.0 g |
| pH (25° C.) | 13.0 |

(Y)

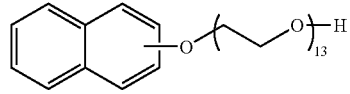

(P)

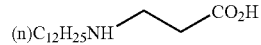

(Q)

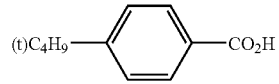

Photosensitive Material A

Photosensitive Material A was prepared based on Example 1 of JP-A-2000-231188. The photosensitive plate precursor thus-obtained was imagewise exposed by Printer FT26V2UPNS (light source: 2 kW metal halide lamp, produced by Nuark in USA) for one minute.

Photosensitive Material B

Photosensitive Material B was prepared based on Example 1 of JP-A-7-295212. The photosensitive plate precursor thus-obtained was imagewise exposed by Printer FT26V2UPNS (light source: 2 kW metal halide lamp, produced by Nuark in USA) in 50 counts.

Photosensitive Material C

A 0.3 mm-thick aluminum plate (material: 1050) was cleansed with trichloroethylene to degrease. Then, the surface of aluminum plate was grained using a nylon brush and a 400-mesh pumice-water suspension, followed by thoroughly washing with water. After the washing, the aluminum plate was dipped in a 25% aqueous sodium hydroxide solution at 45° C. for 9 seconds to conduct etching, washed with water, further dipped in a 20% aqueous nitric acid solution for 20 seconds, and again washed with water. At this time, an etching amount of the grained surface was about 3 g/m$^2$. Subsequently, the aluminum plate was treated using 7% sulfuric acid as an electrolytic solution and passing direct current of a current density of 15 A/dm$^2$ to provide an anodic oxide film of 3 g/m$^2$, then washed with water and dried. The aluminum plate was treated with a 2.5% aqueous sodium silicate solution at 30° C. for 10 seconds and then, a coating solution for undercoat layer shown below was coated and dried at 80° C. for 15 seconds, thereby preparing a support. A coating amount of the undercoat layer after drying was 15 mg/m$^2$.

Coating Solution for Undercoat Layer

| | |
|---|---|
| Copolymer P shown below (molecular weight: 28,000) | 0.3 g |
| Methanol | 100 g |
| Water | 1 g |

Copolymer P

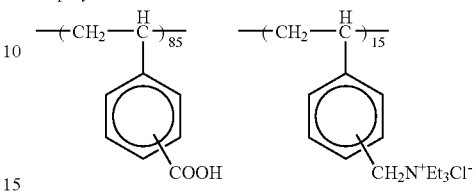

Synthesis of Specific Copolymer

Synthesis Example (Synthesis of Specific Copolymer 1):

Into a 500 ml-volume three-necked flask equipped with a stirrer, a condenser tube and a dropping funnel were charged 31.0 g (0.36 mol) of methacrylic acid, 39.1 g (0.36 mol) of ethyl chloroformate and 200 ml of acetonitrile, and the resulting mixture was stirred under cooling in an ice water bath. To the mixture, 36.4 g (0.36 mol) of triethylamine was added dropwise through the dropping funnel over a period of about one hour. After the completion of the dropwise addition, the ice water bath was removed, and the mixture was stirred at room temperature for 30 minutes. To the reaction mixture was added 51.7 g (0.30 mol) of p-aminobenzenesulfonamide, and the resulting mixture was stirred for one hour while heating to 70° C. on an oil bath. After the completion of the reaction, the reaction mixture was poured into one liter of water while stirring the water, and the resulting mixture was stirred for 30 minutes. The mixture was filtered to collect deposit and the deposit was made into a slurry with 500 ml of water. The slurry was filtered and the resulting solid was dried to obtain a white solid of N-(p-aminosulfonylphenyl)methacrylamide (yield: 46.9 g).

Subsequently, 4.61 g (0.0192 mol) of N-(p-aminosulfonylphenyl)methacrylamide, 2.94 g (0.0258 mol) of ethyl methacrylate, 0.80 g (0.015 mol) of acrylonitrile and 20 g of N,N-dimethylacetamide were charged into a 20 ml-volume three-necked flask equipped with a stirrer, a condenser tube and a dropping funnel, and the resulting mixture was stirred under heating to 65° C. on a hot water bath. To the mixture was added 0.15 g of V-65 (produced by Wako Pure Chemical Industries, Ltd.), and the resulting mixture was stirred under a nitrogen stream while keeping the temperature at 65° C. for 2 hours. To the reaction mixture was further added dropwise a mixture containing 4.61 g of N-(p-aminosulfonylphenyl)methacrylamide, 2.94 g of ethyl methacrylate, 0.80 g of acrylonitrile, N,N-dimethylacetamide and 0.15 g of V-65 through the dropping funnel over a period of 2 hours. After the completion of the dropwise addition, the resulting mixture was further stirred at 65° C. for 2 hours. After the completion of the reaction, 40 g of methanol was added to the mixture, and the resulting mixture was cooled and poured into 2 liters of water while stirring the water, followed by stirring for 30 minutes. Then, the deposit was collected by filtration and dried to obtain 15 g of a white solid. A weight average molecular weight of the resulting specific copolymer measured by gel permeation chromatography and calculated in terms of standard polystyrene was 53,000.

On the support described above, a coating solution for image recording layer shown below was coated to have a dry coating amount of 1.8 g/M² to prepare a positive infrared-sensitive lithographic printing plate precursor.

Coating Solution for Image Recording Layer

| | |
|---|---|
| Copolymer 1 shown above | 0.4 g |
| m, p-Cresol novolak (m/p ratio = 6/4, weight average molecular weight: 8,000, containing 0.5% of unreacted cresol) | 0.6 g |
| Cyanine Dye A shown hereinbefore | 0.1 g |
| Phthalic anhydride | 0.05 g |
| p-Toluenesulfonic acid | 0.002 g |
| Ethyl Violet (counter ion: 6-hydroxy-β-naphthalenesulfonic acid) | 0.02 g |
| Esterified product of naphthoquinone-1,2-diazido-5-sulfonyl chloride and pyrogallol-acetone resin | 0.01 g |
| Fluorine-containing surfactant (Megafac F-177, produced Dai-Nippon Ink & Chemicals, Inc.) | 0.05 g |
| Methyl ethyl ketone | 8 g |
| 1-Methoxy-2-propanol | 4 g |

Photosensitive Material D

Preparation of Support

Aluminum Plate

Molten metal was prepared using an aluminum alloy containing 0.06% by weight of Si, 0.30% by weight of Fe, 0.001% by weight of Cu, 0.001% by weight of Mn, 0.001% by weight of Mg, 0.001% by weight of Zn and 0.03% by weight of Ti and balance of Al and unavoidable impurities, subjected to molten metal treatment and filtration, and made into an ingot of 500 mm in thickness and 1200 mm in width according to a DC casting method. After cutting the surface to a depth of 10 mm on the average using a planer, the ingot was uniformly kept at 550° C. for about 5 hours, and when the temperature of the ingot decreased to 400° C., it was rolled into a 2.7-mm thick rolled plate using a hot rolling machine. Further, it was subjected to thermal treatment at 500° C. using a continuous annealing machine, and then finished into a 0.24-mm thick plate by cold rolling to obtain an aluminum plate of JIS 1050 material. The aluminum plate was cut into pieces of 1030 mm in width, and then subjected to the surface treatment shown below.

Surface Treatment

The surface treatment is carried out by continuously subjecting the aluminum plate to the various treatments (a) to (j) shown below in order. Each of the treatments and washings was followed by removing the remaining liquid by means of nip rollers.

(a) Mechanical Surface-Roughening Treatment

Mechanical surface-roughening treatment of the aluminum plate was conducted by means of rotating roller-form nylon brushes while supplying a suspension of an abrasive (pumice) in water having specific gravity of 1.12 as an abrasion slurry solution to the surface of the aluminum plate. An average particle size of the abrasive was 30 μm, with the maximum particle size being 100 μm. A material of the nylon brush was 6·10 nylon, and the brush has a bristle length of 45 mm and a bristle diameter of 0.3 mm. The nylon brush was made by making holes in a stainless steel cylinder having a diameter of 300 mm and densely filling the brush bristles. Three of the rotating nylon brushes were used. Two supporting rollers (having a diameter of 200 mm) provided under the brush rollers were spaced 300 mm. The brush rollers were pressed against the aluminum plate till the load applied to a driving motor for rotating the brush became 7 kW greater than the load before pressing the brush rollers against the aluminum plate. The rotating direction of the brushes was the same as the moving direction of the aluminum plate. The rotation number of the brushes was 200 rpm.

(b) Alkali-Etching Treatment

Etching treatment of the aluminum plate was conducted by spraying an aqueous solution having a sodium hydroxide concentration of 2.6% by weight, an aluminum ion concentration of 6.5% by weight and temperature of 70° C. to dissolve the aluminum plate in an amount of 10 g/m², followed by washing with water by spraying.

(c) Desmut Treatment

Desmut treatment of the aluminum plate was conducted by spraying an aqueous solution having temperature of 30° C. and a nitric acid concentration of 1% by weight (containing 0.5% by weight of aluminum ion), followed by washing with water by spraying. The aqueous nitric acid solution used for the desmut treatment was a waste solution from the step of conducting electrochemical surface-roughening treatment in an aqueous nitric acid solution using alternating current described below.

(d) Electrochemical Surface-Roughening Treatment

Electrochemical surface-roughening treatment of the aluminum plate was continuously conducted by applying a 60 Hz alternating current voltage. The electrolytic solution used was an aqueous solution containing 10.5 g/liter of nitric acid (containing 5 g/liter of aluminum ion and 0.007% by weight of ammonium ion) and having solution temperature of 50° C. The electrochemical surface-roughening treatment was conducted using an alternating current source, which provides a trapezoidal rectangular wave alternating current where time (TP) for reaching the current to its peak from zero was 0.8 msec and duty ratio was 1:1, and using a carbon electrode as a counter electrode. A ferrite was used as an auxiliary anode.

The current density was 30 A/dm² at the peak current, and the electric amount was 220 C/dm² in terms of the total electric amount during the aluminum plate functioning as an anode. To the auxiliary anode, 5% of the current from the electric source was provided. Subsequently, the plate was washed with water by spraying.

(e) Alkali-Etching Treatment

Etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.50 g/m². Thus, the smut component mainly comprising aluminum hydroxide formed in the precedent electrochemical surface-roughening treatment using alternating current was removed and an edge portion of the pit was dissolved away to smoothen the edge portion. Subsequently, the plate was washed with water by spraying.

(f) Desmut Treatment

Desmut treatment of the aluminum plate was conducted by spraying an aqueous solution having temperature of 30° C. and nitric acid concentration of 15% by weight (containing 4.5% by weight of aluminum ion), followed by washing with water by spraying. The aqueous nitric acid solution used for the desmut treatment was a waste solution from the step of conducting electrochemical surface-roughening treatment in an aqueous nitric acid solution using alternating current described above.

(g) Electrochemical Surface-Roughening Treatment

Electrochemical surface-roughening treatment of the aluminum plate was continuously conducted by applying a 60 Hz alternating current voltage. The electrolytic solution used was an aqueous solution containing 50 g/liter of hydrochloric acid (containing 5 g/liter of aluminum ion) and having temperature of 35° C. The electrochemical surface-roughening treatment was conducted using an alternating current source, which provides a trapezoidal rectangular wave alternating current where time (TP) for reaching the current to its peak from zero was 0.8 msec and duty ratio was 1:1, and using a carbon electrode as a counter electrode. A ferrite was used as an auxiliary anode.

The current density was 25 A/dm$^2$ at the peak current, and the electric amount was 50 C/dm$^2$ in terms of the total electric amount during the aluminum plate functioning as an anode. Subsequently, the plate was washed with water by spraying.

(h) Alkali-Etching Treatment

Etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.10 g/m$^2$. Thus, the smut component mainly comprising aluminum hydroxide formed in the precedent electrochemical surface-roughening treatment using alternating current was removed and an edge portion of the pit was dissolved away to smoothen the edge portion. Subsequently, the plate was washed with water by spraying.

(i) Desmut Treatment

Desmut treatment of the aluminum plate was conducted by spraying an aqueous solution having temperature of 60° C. and sulfuric acid concentration of 25% by weight (containing 0.5% by weight of aluminum ion), followed by washing with water by spraying.

(j) Anodizing Treatment

Anodizing treatment of the aluminum plate was conducted using an anodizing treatment apparatus. A sulfuric acid solution was used as an electrolytic solution supplied to a first and second electrolytic units. The electrolytic solution had sulfuric acid concentration of 170 g/liter (containing 0.5% by weight of aluminum ion) and temperature of 38° C. Subsequently, the plate was washed with water by spraying. The final oxide film amount was 2.7 g/m$^2$.

The surface roughness (Ra) of the resulting aluminum support was 0.45.

Undercoat

An undercoat solution shown below was coated on the aluminum support by a wire bar and dried at 90° C. for 30 seconds using a hot air drying apparatus. A coating amount of the undercoat after drying was 10 mg/m$^2$.

Undercoat Solution

| | |
|---|---|
| Copolymer of ethyl acrylate and sodium salt of 2-acrylamido-2-methyl-1-propanesulfonate (75:15 in molar ratio) | 0.1 g |
| 2-Aminoethylphosphonic acid | 0.1 g |
| Methanol | 50 g |
| Ion-exchanged water | 50 g |

Photosensitive Layer

A coating solution for photosensitive layer [P-1] shown below was prepared and coated on the aluminum support having the undercoat described above by a wire bar, followed by drying at 122° C. for 43.5 seconds using a hot air drying apparatus to form a photosensitive layer. A coverage of the photosensitive layer after drying was 1.4 g/m$^2$.

Coating Solution for Photosensitive Layer [P-1]

| | |
|---|---|
| Infrared absorber (IR-1) shown below | 0.08 g |
| Polymerization Initiator (OS-1) shown below | 0.25 g |
| Dipentaerythritol hexaacrylate | 1.00 g |
| Binder Polymer (BT-1) shown below | 1.00 g |
| Chloride salt of Ethyl Violet | 0.04 g |
| Fluorine-containing surfactant (Megafac F-780-F, produced Dai-Nippon Ink & Chemicals, Inc.) | 0.03 g |
| Methyl ethyl ketone | 10.4 g |
| Methanol | 4.83 g |
| 1-Methoxy-2-propanol | 10.4 g |

The structures of Infrared absorber (IR-1), Polymerization initiator (OS-1) and Binder Polymer (BT-1) are shown below.

Infrared absorber (IR-1)

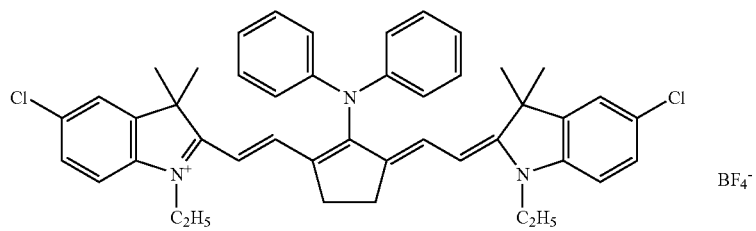

Polymerization Initiator (OS-1)

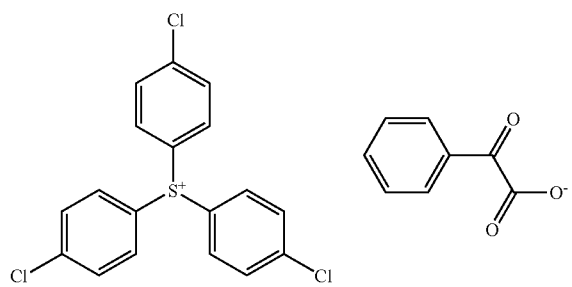

Binder Polymer (BT-1)

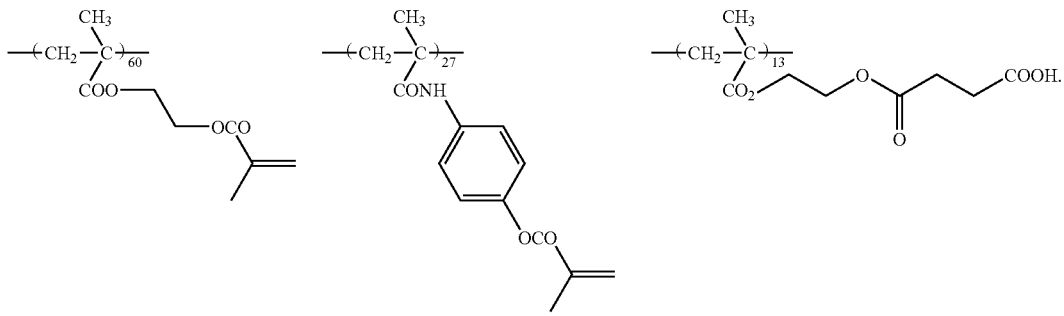

Protective Layer (Overcoat Layer)

An aqueous solution of a mixture of polyvinyl alcohol (saponification degree: 98% by mole; polymerization degree: 500) and polyvinyl pyrrolidone (Luviskol K-30, produced by BASF) was coated on the surface of the photosensitive layer by a wire bar and dried at 125° C. for 75 seconds using a hot air drying apparatus. The content of polyvinyl alcohol was 85% by weight. A coating amount (coverage after drying) of the protective layer was 2.45 g/m². A dynamic friction coefficient of the surface was 0.45. Thus, Photosensitive Material D was prepared.

Photosensitive Material E

A 0.3 mm-thick aluminum plate of 1S material was thoroughly washed with water, dipped in a 10% aqueous sodium hydroxide solution at 70° C. for 60 seconds to conduct etching, washed with running water, and treated with 20% nitric acid to neutralize and cleanse, followed by washing with water. The aluminum plate was then subjected to electrolytic surface-roughening treatment in a 1.5% aqueous nitric acid solution using an alternating waveform current of a sign wave under the condition of $V_A$ of 12.7 V in an amount of electricity of 270 coulomb/dm² at anode. The surface roughness of the plate measured was 0.30 μm (in Ra). Subsequently, the plate was dipped in a 30% aqueous sulfuric acid solution at 40° C. for 2 minutes to conduct desmutting and then subjected to anodic oxidation in a 20% aqueous sulfuric acid solution at 33° C. in a current density of 5 A/dm² for 50 seconds while arranging an cathode on the side of the grained surface of the plate to form an anodic oxide film having a thickness of 2.7 g/m².

A coating solution for intermediate layer having the composition shown below was coated on the aluminum plate thus-treated and dried so as to have a dry coating amount of 2 mg/m² and dried at 100° C. for 3 minutes.

Coating Solution for Intermediate Layer

The composition shown below was mixed and stirred, and after about 5 minutes, generation of heat was observed. After the reaction for 60 minutes, 20,000 g of methanol was added to the reaction mixture.

| | |
|---|---|
| Methanol | 100 g |
| DDP-8 (phosphoric acid compound, produced by Nikko Chemical Co., Ltd.) | 15 g |
| Water | 10 g |
| Phosphoric acid | 5 g |
| Tetraethoxysilane | 50 g |
| 3-Methacryloxypropyltriethoxysilane | 50 g |

A high-sensitive photopolymerizable composition 1 having the composition shown below was coated on the intermediate layer so as to have a dry coating amount of 1.5 g/m² and dried at 100° C. for 90 seconds to prepare a photosensitive layer.

Photopolymerizable Composition 1

| | |
|---|---|
| Ethylenically Unsaturated Bond-Containing Compound (A1) shown below | 1.8 g |
| Linear Organic Polymer Binder (B1) | 1.5 g |
| Sensitizer (C1) | 0.15 g |
| Photo-Initiator (D1) | 0.2 g |
| Dispersion of β-phthalocyanine (F1) | 0.2 g |
| Fluorine-containing nonionic surfactant (Megafac F177, produced Dai-Nippon Ink & Chemicals, Inc.) | 0.03 g |
| Methyl ethyl ketone | 10 g |
| Propylene glycol monomethyl ether acetate | 10 g |

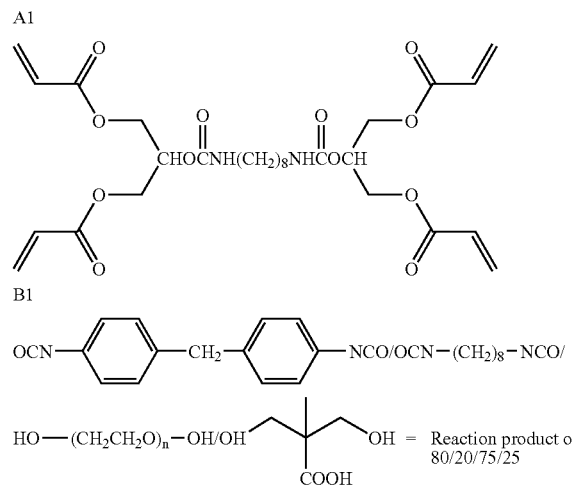

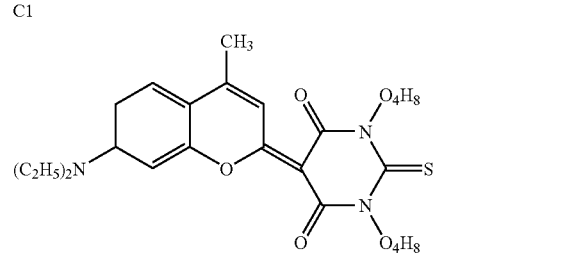

-continued

D1
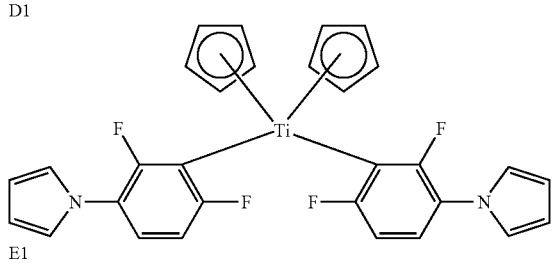

E1
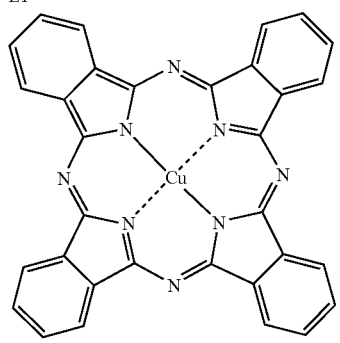

A 3% by weight aqueous solution of polyvinyl alcohol (saponification degree: 98% by mole; polymerization degree: 500) was coated on the photopolymerizable photosensitive layer thus-prepared so as to have a dry coating amount of 2.5 g/m² and dried at 100° C. for 90 seconds to prepare Photosensitive Material E.

Processing of Examples 1 to 7

Gradation density stability of high resolution image, that is, development sensitivity stability on high resolution image, in the case of conducting a continuous processing using the replenishment method (control flow: FIG. 5) of the present invention as shown in Tables 1 to 3 below was evaluated. For the evaluation, a halftone image formed from an image having a gradation density of 50% using Screening A as shown in Table 6 below was used as an ordinary resolution image, and halftone images each formed from an image having a gradation density of 50% using Screening B, Screening C, Screening D or Screening E as shown in Table 6 below were used as the high resolution images. In the evaluation of development sensitivity stability on high resolution image, the photosensitive material shown in Table 1 below was exposed with the halftone image having a gradation density of 50% and subjected to the development processing under the conditions described in Tables 1 to 6, and then to what extent the gradation density on the photosensitive material was changed was examined. The results are shown in Table 7 below.

TABLE 1

| | Replenishment system | Photosensitive Material | Developer | Replenisher | Processing Condition | Halftone Forming Method |
|---|---|---|---|---|---|---|
| Example 1 | System of Present Invention (control system shown in FIG. 5) | Photosensitive Material A Photosensitive Material B | Developer A | Replenisher A | Processing Condition 1 | Screening A |
| Example 2 | System of Present Invention (control system shown in FIG. 5) | Photosensitive Material A Photosensitive Material B | Developer A | Replenisher A | Processing Condition 1 | Screening B |
| Example 3 | System of Present Invention (control system shown in FIG. 5) | Photosensitive Material A Photosensitive Material B Photosensitive Material C | Developer B | Replenisher B | Processing Condition 2 | Screening B |
| Example 4 | System of Present Invention (control system shown in FIG. 5) | Photosensitive Material A Photosensitive Material B Photosensitive Material C | Developer B | Replenisher B | Processing Condition 2 | Screening C |
| Example 5 | System of Present Invention (control system shown in FIG. 5) | Photosensitive Material D | Developer C | Replenisher C | Processing Condition 3 | Screening C |
| Example 6 | System of Present Invention (control system shown in FIG. 5) | Photosensitive Material E | Developer D | Replenisher D | Processing Condition 4 | Screening D |
| Example 7 | System of Present Invention (control system shown in FIG. 5) | Photosensitive Material E | Developer D | Replenisher D | Processing Condition 4 | Screening E |
| Comparative Example 1 | Area and Time Lapse-Based Replenishment System | Photosensitive Material A Photosensitive Material B | Developer A | Replenisher A | Processing Condition 5 | Screening A |
| Comparative Example 2 | Area and Time Lapse-Based Replenishment System | Photosensitive Material A Photosensitive Material B | Developer A | Replenisher A | Processing Condition 5 | Screening B |
| Comparative Example 3 | Area and Time Lapse-Based Replenishment System | Photosensitive Material A Photosensitive Material B Photosensitive Material C | Developer B | Replenisher B | Processing Condition 6 | Screening B |
| Comparative Example 4 | Area and Time Lapse-Based Replenishment System | Photosensitive Material A Photosensitive Material B Photosensitive Material C | Developer B | Replenisher B | Processing Condition 6 | Screening C |
| Comparative Example 5 | Area and Time Lapse-Based Replenishment System | Photosensitive Material D | Developer C | Replenisher C | Processing Condition 7 | Screening C |
| Comparative Example 6 | Area and Time Lapse-Based Replenishment System | Photosensitive Material E | Developer D | Replenisher D | Processing Condition 8 | Screening D |

TABLE 1-continued

|  | Replenishment system | Photosensitive Material | Developer | Replenisher | Processing Condition | Halftone Forming Method |
|---|---|---|---|---|---|---|
| Comparative Example 7 | Area and Time Lapse-Based Replenishment System | Photosensitive Material E | Developer D | Replenisher D | Processing Condition 8 | Screening E |
| Comparative Example 8 | Electric Conductivity-Based Replenishment System* | Photosensitive Material A Photosensitive Material B | Developer A | Replenisher A | Processing Condition 5 | Screening A |
| Comparative Example 9 | Electric Conductivity-Based Replenishment System* | Photosensitive Material A Photosensitive Material B | Developer A | Replenisher A | Processing Condition 5 | Screening B |
| Comparative Example 10 | Electric Conductivity-Based Replenishment System* | Photosensitive Material A Photosensitive Material B Photosensitive Material C | Developer B | Replenisher B | Processing Condition 6 | Screening B |
| Comparative Example 11 | Electric Conductivity-Based Replenishment System* | Photosensitive Material A Photosensitive Material B Photosensitive Material C | Developer B | Replenisher B | Processing Condition 6 | Screening C |
| Comparative Example 12 | Electric Conductivity-Based Replenishment System* | Photosensitive Material D | Developer C | Replenisher C | Processing Condition 7 | Screening C |
| Comparative Example 13 | Electric Conductivity-Based Replenishment System* | Photosensitive Material E | Developer D | Replenisher D | Processing Condition 8 | Screening D |
| Comparative Example 14 | Electric Conductivity-Based Replenishment System* | Photosensitive Material E | Developer D | Replenisher D | Processing Condition 8 | Screening E |

*Method described in JP-A-64-21451 corresponding to U.S. Pat. No. 4,882,246

TABLE 2

|  | Automatic Developing Machine | Volume of Developing Tank | Development Temperature | Development Time | Time Lapse Replenishment Amount in Operating time | Time Lapse Replenishment Amount in Stopped Time | Processing Replenishment amount | Processing Pattern |
|---|---|---|---|---|---|---|---|---|
| Processing Condition 1 | FIG. 6 | 20,000 ml | 30° C. | 12 sec. | — | — | — | Table 3 |
| Processing Condition 2 | FIG. 1 | 20,000 ml | 30° C. | 12 sec. | — | — | — | Table 4 |
| Processing Condition 3 | FIG. 1 | 20,000 ml | 30° C. | 12 sec. | — | — | — | Table 5 |
| Processing Condition 4 | FIG. 1 | 20,000 ml | 28° C. | 18 sec. | — | — | — | Table 5 |
| Processing Condition 5 | FIG. 6 | 20,000 ml | 30° C. | 12 sec. | 220 ml/h | 100 ml/h | 40 ml/m$^2$ | Table 3 |
| Processing Condition 6 | FIG. 1 | 20,000 ml | 30° C. | 12 sec. | 50 ml/h | 15 ml/h | 20 ml/m$^2$ | Table 4 |
| Processing Condition 7 | FIG. 1 | 45,000 ml | 30° C. | 12 sec. | 40 ml/h | 30 ml/h | 40 ml/m$^2$ | Table 5 |
| Processing Condition 8 | FIG. 1 | 20,000 ml | 28° C. | 18 sec. | 40 ml/h | 40 ml/h | 100 ml/m$^2$ | Table 5 |

TABLE 3

Processing Amount per Day (area of plate × number of plate)

|  |  | Day | | | | | | | | | |
|---|---|---|---|---|---|---|---|---|---|---|---|
|  |  | 1st | 2nd | 3rd | 4th | 5th | 8th | 9th | 10th | 11th | 12th |
|  |  | \multicolumn{10}{c}{Day of Week} |
|  |  | Mon | Tue | Wed | Thu | Fri | Mon | Tue | Wed | Thu | Fri |
| Photosensitive Material A (m$^2$ × plate) | AM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
|  | PM | 0.8 × 13 | 0.8 × 13 | 0.8 × 13 | 0.8 × 42 | 0.8 × 7 | 0 | 0.8 × 7 | 0 | 0.8 × 7 | 0.8 × 4 |
| Photosensitive Material B (m$^2$ × plate) | AM | 0 | 0 | 0 | 0 | 0 | 0.8 × 7 | 0 | 0.8 × 7 | 0 | 0 |
|  | PM | 0 | 0 | 0 | 0 | 0 | 0.8 × 7 | 0 | 0.8 × 7 | 0 | 0 |
| Total (m$^2$) |  | 21 | 21 | 21 | 67 | 11 | 11 | 11 | 11 | 11 | 6 |

TABLE 4

Processing Amount per Day (area of plate × number of plate)

| | | Day | | | | | | | | | |
|---|---|---|---|---|---|---|---|---|---|---|---|
| | | 1st | 2nd | 3rd | 4th | 5th | 8th | 9th | 10th | 11th | 12th |
| | | \_ | \_ | \_ | \_ | Day of Week | | | | | |
| | | Mon | Tue | Wed | Thu | Fri | Mon | Tue | Wed | Thu | Fri |
| Photosensitive Material C (m² × plate) | AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 |
| | PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 |
| Photosensitive Material B (m² × plate) | AM | 0.8 × 6 | 0.8 × 6 | 0.8 × 6 | 0.8 × 20 | 0.8 × 3 | 0 | 0.8 × 3 | 0 | 0.8 × 3 | 0 |
| | PM | 0.8 × 7 | 0.8 × 7 | 0.8 × 7 | 0.8 × 20 | 0.8 × 4 | 0 | 0.8 × 4 | 0 | 0.8 × 4 | 0 |
| Photosensitive Material A (m² × plate) | AM | 0 | 0 | 0 | 0 | 0 | 0.8 × 3 | 0 | 0.8 × 3 | 0 | 0 |
| | PM | 0 | 0 | 0 | 0 | 0 | 0.8 × 4 | 0 | 0.8 × 4 | 0 | 0 |
| Total (m²) | | 21 | 21 | 21 | 67 | 11 | 9 | 11 | 9 | 11 | 3 |

TABLE 5

Processing Amount per Day (area of plate × number of plate)

| | | Day | | | | | | | | | |
|---|---|---|---|---|---|---|---|---|---|---|---|
| | | 1st | 2nd | 3rd | 4th | 5th | 8th | 9th | 10th | 11th | 12th |
| | | | | | | Day of Week | | | | | |
| | | Mon | Tue | Wed | Thu | Fri | Mon | Tue | Wed | Thu | Fri |
| Photo-sensitive Material A (m² × plate) | AM | 0.8 × 13 | 0.8 × 13 | 0.8 × 13 | 0.8 × 42 | 0.8 × 7 | 0.4 × 14 | 0.4 × 14 | 0.4 × 14 | 0.4 × 14 | 0.4 × 14 |
| | PM | 0.8 × 13 | 0.8 × 13 | 0.8 × 13 | 0.8 × 42 | 0.8 × 7 | 0.4 × 14 | 0.4 × 14 | 0.4 × 14 | 0.4 × 14 | 0.4 × 14 |
| Total (m²) | | 21 | 21 | 21 | 67 | 11 | 11 | 11 | 11 | 11 | 6 |

TABLE 6

| | Name of Screening |
|---|---|
| Screening A | AM Screening (175 lpi) |
| Screening B | AM Screening (300 lpi)(Co-Re Screen, produced by Fuji Photo Film Co., Ltd. |
| Screening C | FM Screening (Staccato 20, produced by CREO Inc.) |
| Screening D | FM Screening (Randot X20, produced by Dainippon Screen Mfg. Co., Ltd.) |
| Screening E | FM Screening (Fairdot, produced by Dainippon Screen Mfg. Co., Ltd.) |

TABLE 7

Change in 50% Gradation Density (assuming that the density at the start on the 1st day is ±0.0%)

| | Day | | | | | | | | | |
|---|---|---|---|---|---|---|---|---|---|---|
| | 1st | 2nd | 3rd | 4th | 5th | 8th | 9th | 10th | 11th | 12th |
| Example 1 | ±0.0% | ±0.0% | −0.25% | −0.25% | −0.5% | −0.25% | +0.25% | +0.5% | +0.25% | +0.5% |
| Example 2 | ±0.0% | −0.25% | +0.25% | −0.5% | −0.25% | ±0.0% | ±0.0% | ±0.0% | +0.25% | +0.5% |
| Example 3 | ±0.0% | −0.25% | ±0.0% | −0.5% | −0.25% | −0.25% | +0.25% | +0.25% | ±0.0% | +0.75% |
| Example 4 | ±0.0% | ±0.0% | +0.5% | −0.75% | −0.5% | ±0.0% | ±0.0% | ±0.0% | +0.5% | +0.5% |
| Example 5 | ±0.0% | +0.25% | −0.25% | −0.5% | ±0.0% | −0.25% | ±0.0% | +0.25% | +0.25% | +0.5% |
| Example 6 | ±0.0% | +0.25% | ±0.0% | −0.75% | −0.25% | ±0.0% | ±0.0% | +0.25% | +0.25% | +0.75% |
| Example 7 | ±0.0% | −0.25% | −0.25% | −0.5% | −0.5% | −0.5% | +0.25% | ±0.0% | +0.5% | +0.75% |
| Comparative Example 1 | ±0.0% | +0.25% | ±0.0% | −0.25% | −0.5% | −0.5% | −0.75% | −1.0% | −0.75% | −1.0% |
| Comparative Example 2 | ±0.0% | −0.25% | ±0.0% | +0.5% | +0.25% | −1.5% | −1.75% | −3.25% | −3.5% | −3.0% |
| Comparative Example 3 | ±0.0% | +0.5% | +0.25% | +0.25% | −0.25% | +1.5% | +1.25% | +2.75% | +3.25% | +3.25% |
| Comparative Example 4 | ±0.0% | +0.25% | +0.5% | ±0.0% | −0.25% | +1.5% | +1.5% | +3.0% | +3.5% | +3.25% |
| Comparative Example 5 | ±0.0% | −0.25% | −0.5% | ±0.0% | +0.25% | −0.75% | −1.5% | −2.25% | −2.75% | −3.25% |
| Comparative Example 6 | ±0.0% | +0.25% | +0.5% | +0.25% | +0.25% | −0.5% | −1.5% | −2.0% | −3.0% | −3.5% |

TABLE 7-continued

Change in 50% Gradation Density
(assuming that the density at the start on the 1st day is ±0.0%)

| | Day | | | | | | | | | |
|---|---|---|---|---|---|---|---|---|---|---|
| | 1st | 2nd | 3rd | 4th | 5th | 8th | 9th | 10th | 11th | 12th |
| Comparative Example 7 | ±0.0% | −0.25% | −0.5% | −0.5% | −0.25% | −0.75% | −1.25% | −1.75% | −2.5% | −3.0% |
| Comparative Example 8 | ±0.0% | +0.25% | −0.25% | −0.75% | −0.5% | −0.25% | ±0.0% | +0.25% | +0.25% | +0.5% |
| Comparative Example 9 | ±0.0% | −0.5% | −0.25% | −1.25% | −0.75% | ±0.0% | +0.5% | +0.75% | +1.5% | +2.5% |
| Comparative Example 10 | ±0.0% | +0.25% | +0.5% | −1.5% | −1.25% | −0.5% | ±0.0% | +0.25% | +1.75% | +2.75% |
| Comparative Example 11 | ±0.0% | −0.25% | −0.5% | −1.5% | −0.75% | −0.25% | ±0.0% | +0.5% | +1.5% | +2.25% |
| Comparative Example 12 | ±0.0% | +0.5% | +0.25% | −1.75% | −1.0% | ±0.0% | +0.25% | +0.5% | +1.25% | +2.5% |
| Comparative Example 13 | ±0.0% | −0.25% | −0.25% | −1.25% | ±0.0% | −0.5% | −1.25% | −0.5% | +1.0% | +2.5% |
| Comparative Example 14 | ±0.0% | −0.25% | +0.5% | −1.5% | +0.25% | −0.75% | −1.75% | −0.75% | +0.75% | +2.75% |

Processing of Comparative Examples 1 to 14

Gradation density stability of high resolution image, that is, development sensitivity stability on high resolution image, in the case of conducting a continuous processing using the area and time lapse-based replenishment system or the electric conductivity-based replenishment system as shown in Tables 1 to 5 was evaluated. For the evaluation, a halftone image formed from an image having a gradation density of 50% using Screening A as shown in Table 6 was used as an ordinary resolution image, and halftone images each formed from an image having a gradation density of 50% using Screening B, Screening C, Screening D or Screening E as shown in Table 6 were used as the high resolution images. In the evaluation of development sensitivity stability on high resolution image, the photosensitive material shown in Table 1 was exposed with the halftone image having a gradation density of 50% and subjected to the development processing under the conditions described in Tables 1 to 6, and then to what extent the gradation density on the photosensitive material was changed was examined. The results are shown in Table 7.

From the evaluations described above, it can be confirmed in the case of processing the high resolution image that although the change of 50% gradation density falls within the allowable range from −1.0% to +1.0% in Examples 2 to 7 using the replenishment method of the present invention, the change of 50% gradation density is out of the allowable range from −1.0% to +1.0% in Comparative Examples 2 to 7 and Comparative Examples 9 to 14.

According to the present invention, irrespective of resolution of image, the desired gradation density can be reproduced and an automatic development processing can be stably realized for a long period of time by using an appropriate reference value of electric conductivity in the case of processing a high resolution image (an image in which an output datum of 50% area ratio is 210 lpi (Lines Per Inch) or more in terms of a peripheral length of an image area in an image unit that constitutes a gradation of a screen image) in a method for replenishing a development replenisher wherein an electric conductivity of a developer is measured, the electric conductivity value of the developer obtained is compared with a predetermined reference value of electric conductivity, and a development replenisher is replenished to the developer, when the electric conductivity value of the developer is lower than the reference value of electric conductivity.

The entire disclosure of each and every foreign patent application from which the benefit of foreign priority has been claimed in the present application is incorporated herein by reference, as if fully set forth.

What is claimed is:

1. A method for replenishing a development replenisher in an automatic developing machine for a photosensitive lithographic printing plate precursor, wherein a value of an electric conductivity of a developer obtained by measuring an electric conductivity of the developer is compared with a reference value of an electric conductivity, and a development replenisher is replenished to the developer when the value of the electric conductivity of the developer is lower than the reference value of the electric conductivity, the method comprising:

using a reference value of an electric conductivity optimal for a high resolution image as the reference value of the electric conductivity when developing a photosensitive lithographic printing plate precursor having an exposed high resolution image in which an output datum of 50% area ratio is 210 lpi or more in terms of a peripheral length of an image area in an image unit that constitutes a gradation of a screen image: and changing the reference value of the electric conductivity to an ordinary reference value of an electric conductivity when developing a photosensitive lithographic printing plate precursor not having a high resolution image.

2. The method according to claim 1,
wherein the high resolution image is an image comprising an AM screen having 210 lpi or more.

3. The method according to claim 1,
wherein the high resolution image is an image comprising an FM screen including a dot of 30 μm or less that constitutes an image area of the screen image.

4. The method according to claim 1,
wherein the high resolution image comprises at least one of an image comprising an AM screen having 210 lpi or more and an image comprising an FM screen including a dot of 30 μm or less that constitutes an image area of the screen image.

5. The method according to claim 1,
wherein the reference value of the electric conductivity optimal for the high resolution image is adjusted based on a total amount of the photosensitive lithographic printing plate precursor processed with the developer.

6. The method according to claim 1,
wherein the reference value of the electric conductivity optimal for the high resolution image is adjusted based on a replenisher replacement ratio, and
wherein the replenisher replacement ratio is a ratio of the development replenisher replenished to the developer based on the developer.

7. The method according to claim 1,
wherein the reference value of the electric conductivity optimal for the high resolution image is adjusted based on a time lapse replenishment ratio and a replenisher replacement ratio, and
wherein the time lapse replenishment ratio is a ratio of a time lapse replenishment amount calculated from an operating time and a stopped time of the automatic developing machine based on a total replenishment amount, and the replenisher replacement ratio is a ratio of the development replenisher replenished to the developer based on the developer.

* * * * *